(12) United States Patent
Yeh et al.

(10) Patent No.: US 9,720,293 B2
(45) Date of Patent: Aug. 1, 2017

(54) DISPLAY PANEL

(71) Applicant: Au Optronics Corporation, Hsinchu (TW)

(72) Inventors: Chao-Wei Yeh, Taoyuan (TW);
Wei-Cheng Cheng, New Taipei (TW);
Yi-Chi Lee, Taichung (TW);
Chen-Chun Lin, Hsinchu (TW);
Tien-Lun Ting, Taichung (TW)

(73) Assignee: Au Optronics Corporation, Hsinchu (TW)

( * ) Notice: Subject to any disclaimer, the term of this patent is extended or adjusted under 35 U.S.C. 154(b) by 94 days.

(21) Appl. No.: 14/948,402

(22) Filed: Nov. 23, 2015

(65) Prior Publication Data

US 2017/0059945 A1    Mar. 2, 2017

(30) Foreign Application Priority Data

Aug. 24, 2015   (TW) .............................. 104127477 A

(51) Int. Cl.
*G02F 1/1335*     (2006.01)
*G02F 1/1343*     (2006.01)
*H01L 27/12*      (2006.01)
*G02F 1/1368*     (2006.01)
(Continued)

(52) U.S. Cl.
CPC ...... *G02F 1/134309* (2013.01); *G02F 1/1368* (2013.01); *G02F 1/133528* (2013.01); *G02F 1/133707* (2013.01); *G02F 1/134336* (2013.01); *G02F 1/136286* (2013.01); *H01L 27/124* (2013.01); *G02F 2001/133531* (2013.01)

(58) Field of Classification Search
CPC ................. G02F 2001/134345; G02F 1/13524
See application file for complete search history.

(56) References Cited

U.S. PATENT DOCUMENTS

2011/0051065 A1* 3/2011 Seong ............... G02F 1/133711
                                                349/123
2011/0317104 A1   12/2011 Nakamura et al.
(Continued)

FOREIGN PATENT DOCUMENTS

TW          201400950          1/2014

OTHER PUBLICATIONS

Miyakawa et al., "High Transmission VA-LCD with a Three Dimensionally Shaped Pixel Electrode for 4K × 2K Displays," SID Symposium Digest of Technical Papers, Jun. 2013, pp. 107-110.

*Primary Examiner* — Phu Vu
(74) *Attorney, Agent, or Firm* — Jianq Chyun IP Office

(57) ABSTRACT

A display panel includes pixel structures. Each pixel structure includes an active device, a pixel electrode, and a protective layer. The pixel electrode is electrically connected to the active device, wherein the pixel electrode has at least one block-shaped electrode. The protective layer is located below the pixel electrode and includes a recess main portion and recess branched portions. The width of the recess main portion is greater than 0 μm and equal to or less than 4 μm, and the recess branched portions are extended along at least four directions. The pixel electrode covers the recess main portion and the recess branched portions. The display panel includes at least one polarizer, wherein the direction of an adsorption axis of the polarizer is different from the four directions of extension of the recess branched portions.

18 Claims, 20 Drawing Sheets

(51) Int. Cl.
*G02F 1/1362* (2006.01)
*G02F 1/1337* (2006.01)

(56) References Cited

U.S. PATENT DOCUMENTS

2013/0242239 A1 9/2013 Chang et al.
2015/0070611 A1 3/2015 Shima et al.

* cited by examiner

DISPLAY PANEL

CROSS-REFERENCE TO RELATED APPLICATION

This application claims the priority benefit of Taiwan application serial no. 104127477, filed on Aug. 24, 2015. The entirety of the above-mentioned patent application is hereby incorporated by reference herein and made a part of this specification.

BACKGROUND OF THE INVENTION

Field of the Invention

The invention relates to a display panel, and more particularly, to a display panel having a specific pixel structure.

Description of Related Art

Among flat panel displays, the liquid crystal display (LCD) has been widely used. The LCD has two display panels formed by substrates. In the LCD, field-generating electrodes such as pixel electrodes and common electrodes are formed on a substrate, and a liquid crystal layer is disposed between the two display panels. In the LCD, a voltage is applied to the field-generating electrodes to generate an electric field on the liquid crystal layer, and the orientation of liquid crystal molecules of the liquid crystal layer and the polarization of incident light are confirmed via the generated electric field so as to display a pattern.

Among LCDs, a vertical-alignment (VA) mode LCD having high contrast and wide reference viewing angle has received more attention. Specifically, in the case that an electric field is not applied to a VA mode LCD, the main axis (long axis) of liquid crystal molecules thereof is perpendicular to the orientation of the display panel. In particular, in the VA mode LCD, a plurality of areas including liquid crystal molecules of different orientation directions is formed in one pixel electrode in a manner in which only a cut (such as a micro slit) is formed on one pixel electrode, thus forming a wide reference viewing angle. However, in the above method of forming small slits in the pixel electrode via a cut to form a plurality of branched electrodes, since a slight phenomenon of unstable twisting or inclination occurs to the liquid crystal molecules in the cut field-generating electrodes, the liquid crystal efficiency of the liquid crystal display is relatively reduced, thus causing degradation to transmittance. Moreover, the above method may further generate a phenomenon of light leakage in a dark state due to unstable liquid crystal molecule inclination. It should be mentioned that, only a plurality of branched electrodes is in the pixel electrode, and therefore the pixel electrode does not have other pattern or configuration designs. Moreover, the protective layer isolated between the pixel electrode and a transistor also only has a contact hole for connecting the pixel electrode and the transistor, and does not have other pattern or configuration designs.

SUMMARY OF THE INVENTION

The invention provides a display panel capable of having good transmittance, and a pixel structure thereof can increase the stability of liquid crystal reversal and improve contrast ratio.

A display panel of the invention includes a first substrate, a plurality of pixel structures, a second substrate, an opposite electrode, a display medium, and at least one polarizer. Each of the pixel structures includes a scan line, a data line, an active device, a pixel electrode, and a protective layer. The scan line and the data line are located on the first substrate. The active device is located on the first substrate and includes a gate, a source, and a drain, wherein the gate of the active device and the scan line are electrically connected, and the source of the active device and the data line are electrically connected. The pixel electrode is located on the first substrate and electrically connected to the drain of the active device, wherein the pixel electrode has at least one block-shaped electrode. The protective layer is located on the first substrate and below the pixel electrode, wherein the protective layer includes a recess main portion and a plurality of recess branched portions. The width of the recess main portion is greater than 0 µm and less than or equal to 4 µm. The recess branched portions are extended along at least four directions, wherein the pixel electrode conformably covers the recess main portion and the recess branched portions. The second substrate is located at an opposite side of the first substrate. The opposite electrode is located on the second substrate. The display medium is located between the opposite electrode and the pixel electrode. The at least one polarizer is located on at least one of the first substrate and the second substrate, wherein the direction of an adsorption axis of the polarizer is different from the four directions of extension of the recess branched portions of the protective layer.

Based on the above, in the pixel structure of the display panel of the invention, the protective layer has a recess main portion and a plurality of recess branched portions and the pixel electrode has at least one block-shaped electrode conformably covering the recess main portion and the recess branched portions. Via the above disposition, in addition to ensuring the display panel has good transmittance and liquid crystal response time, since the pixel structure of the invention has the desired undulating structure, the phenomenon of unstable liquid crystal reversal can be prevented, thus improving contrast ratio and alleviating the phenomenon of light leakage in a dark state, so as to achieve good display effect.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
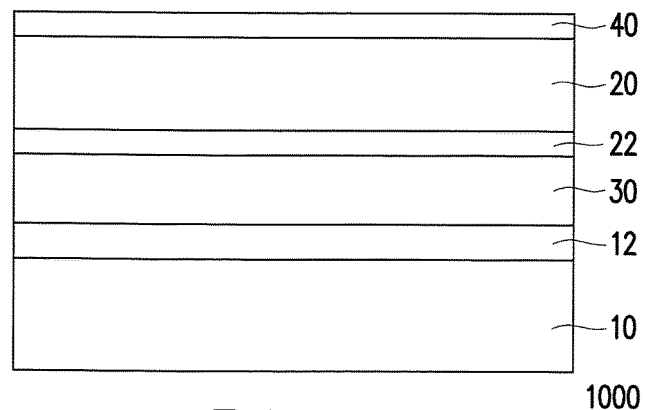
FIG. 1 is a cross-sectional schematic of a display panel according to an embodiment of the invention.

FIG. 1 is a cross-sectional schematic of a display panel 1000 according to an embodiment of the invention. Referring to FIG. 1, the display panel 1000 of the invention has a first substrate 10, a pixel array layer 12, a display medium 30, an opposite electrode 22, a second substrate 20, and at least one polarizer 40. In the invention, the display panel 1000 is a liquid crystal display panel.

The material of the first substrate 10 can be glass, quartz, organic polymer, or other similar materials. A pixel array layer 12 is disposed on the first substrate 10. The pixel array layer 12 includes a plurality of pixel structures, and a detailed structure of the pixel array layer 12 is described later.

The second substrate 20 is disposed opposite to the first substrate 10. The material of the second substrate 20 can be glass, quartz, organic polymer, or other similar materials. A side of the second substrate 20 facing the first substrate 10 has an opposite electrode 22. The material of the opposite electrode 22 includes a metal oxide, such as indium tin oxide, indium zinc oxide, aluminum tin oxide, aluminum zinc oxide, indium germanium zinc oxide, graphene, carbon nanotube, other suitable materials, or stacked layers of at least two of the above.

The display medium 30 is located between the first substrate 10 and the second substrate 20. The display medium 30 can include a liquid crystal molecule, an electrophoretic display medium, or other applicable media. The display medium 30 in the following embodiments of the invention is exemplified by a liquid crystal molecule, but is not limited thereto.

The at least one polarizer 40 is located on the outer surface of the second substrate 20. The display panel 1000 shown in FIG. 1 is an exemplary embodiment of the invention, and for clarity, only one polarizer 40 is shown, but the invention is not limited thereto. In other embodiments, the display panel of the invention can also adopt two or more than two polarizers, and the polarizers are, for instance, external polarizers or internal polarizers, and can be disposed on the outer surface or the inner surface of the first substrate 10 and/or disposed on the inner surface or the outer surface of the second substrate 20. The invention does not particularly limit the disposition location of the polarizers.

Figure 2:
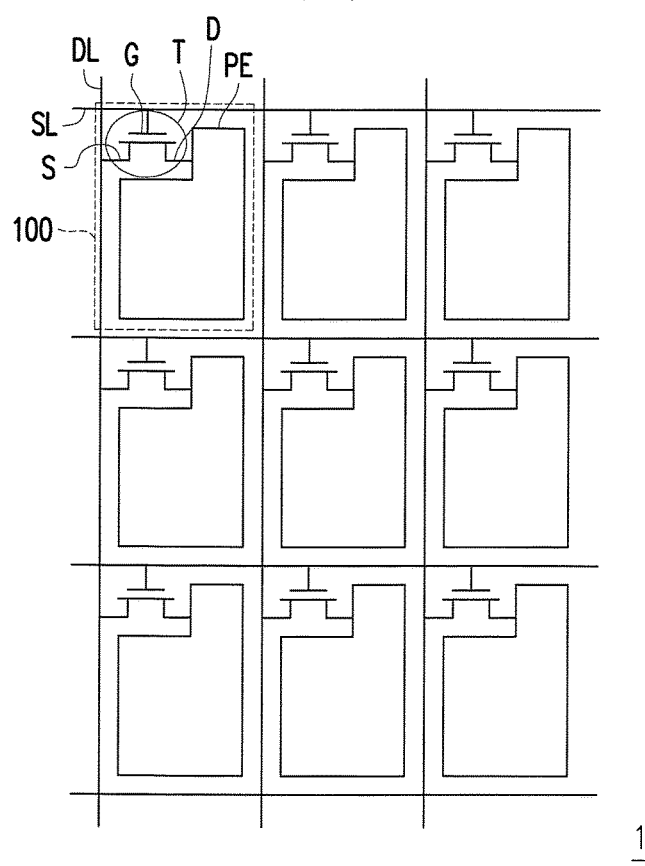
FIG. 2 is a top schematic of a pixel array layer according to an embodiment of the invention.

FIG. 2 is a top schematic of a pixel array layer according to an embodiment of the invention. Referring to both FIG. 1 and FIG. 2, the pixel array layer 12 is located on the first substrate 10, and the display medium 30 covers the pixel array layer 12. The pixel array layer 12 is formed by a plurality of pixel structures 100. The design of the pixel structure 100 is described in detail below with reference to FIG. 2. To clearly describe the present embodiment, FIG. 2 only shows an array of 3×3 pixel structures 100 in the pixel array layer 12. However, those having ordinary skill in the art should understand that, the pixel array layer 12 of FIG. 1 is in actuality formed by an array arranged from a plurality of pixel structures 100.

As shown in FIG. 2, the pixel structure 100 includes a scan line SL, a data line DL, an active device T, and a pixel electrode PE.

The scan line SL and the data line DL are disposed on the first substrate 10. The direction of extension of the scan line SL is different from the direction of extension of the data line DL. The direction of extension of the scan line SL is often perpendicular to the direction of extension of the data line DL, but the invention is not limited thereto. Moreover, the scan line SL and the data line DL are located in different film layers, and an insulation layer (not shown) is sandwiched between the two. The scan line SL and the data line DL are mainly used to transmit a driving signal driving the pixel structure 100, and the driving signal is, for instance, a scanning signal or a data signal. The scan line SL and the data line DL generally include a metal material. However, the invention is not limited thereto. According to other embodiments, the scan line SL and the data line DL can also adopt other conductive materials such as an alloy, metal oxide, metal nitride, metal oxynitride, graphene, carbon nanotube, other suitable conductive materials, or stacked layers of at least two of the above.

The active device T is correspondingly electrically connected to the scan line SL and the data line DL. Here, the active device T is, for instance, a thin-film transistor, and includes a gate G, a channel layer (not shown), a drain D, and a source S, wherein the drain G and the scan line SL are electrically connected, and the source S and the data line DL are electrically connected. In other words, when a control signal is entered into the scan line SL, electrical conduction occurs between the scan line SL and the gate G; and when a data signal is entered into the data line DL, electrical conduction occurs between the data line DL and the source S. The channel layer is located above the gate G and located below the source S and the drain D. The active device T of the present embodiment can be exemplified as a bottom-gate thin-film transistor, but the invention is not limited thereto. In other embodiments, the active device T can also be a top-gate thin-film transistor. In this case, the channel layer is located below the gate G and located below the source S and the drain D. The material of the channel layer includes polysilicon, microcrystalline silicon, single crystal silicon, amorphous silicon, a metal oxide semiconductor material, an organic semiconductor material, graphene, carbon nanotube, other suitable materials, or stacked layers of two of the above materials.

The pixel electrode PE is located on the first substrate 10 and electrically connected to the drain D of the active device T. The pixel electrode PE is, for instance, a transparent conductive layer, and includes a metal oxide, such as indium tin oxide, indium zinc oxide, aluminum tin oxide, aluminum zinc oxide, indium germanium zinc oxide, graphene, carbon nanotube, other suitable materials, or stacked layers of at least two of the above.

A protective layer (not shown) is located on the first substrate 10 and located below the pixel electrode PE. The material of the protective layer includes, for instance, an inorganic material, an organic material, or a single mixed layer or stacked layers of the above materials. The inorganic material includes, for instance, silicon oxide, silicon nitride, silicon oxynitride, graphene nitride, graphene oxide, graphene oxynitride, carbon nanotube nitride, carbon nanotube oxide, carbon nanotube oxynitride, other suitable materials, or stacked layers of at least two of the above materials. The organic material includes colorless photoresist, colored and translucent photoresist, benzocyclobutene (BCB), polyimide (PI), polymethacrylate (PMA), polyester, other suitable materials, or stacked layers of at least two of the above materials.

In the liquid crystal display panel of the invention, an undulating pixel electrode design is needed, and to meet the above demand, the pixel electrode and the protective layer of the pixel structure of the invention can have multiple designs. For clarity, the designs of the pixel electrode and the protective layer of the pixel structures in a plurality of embodiments of the invention are described in detail with reference to figures.

Figure 3:
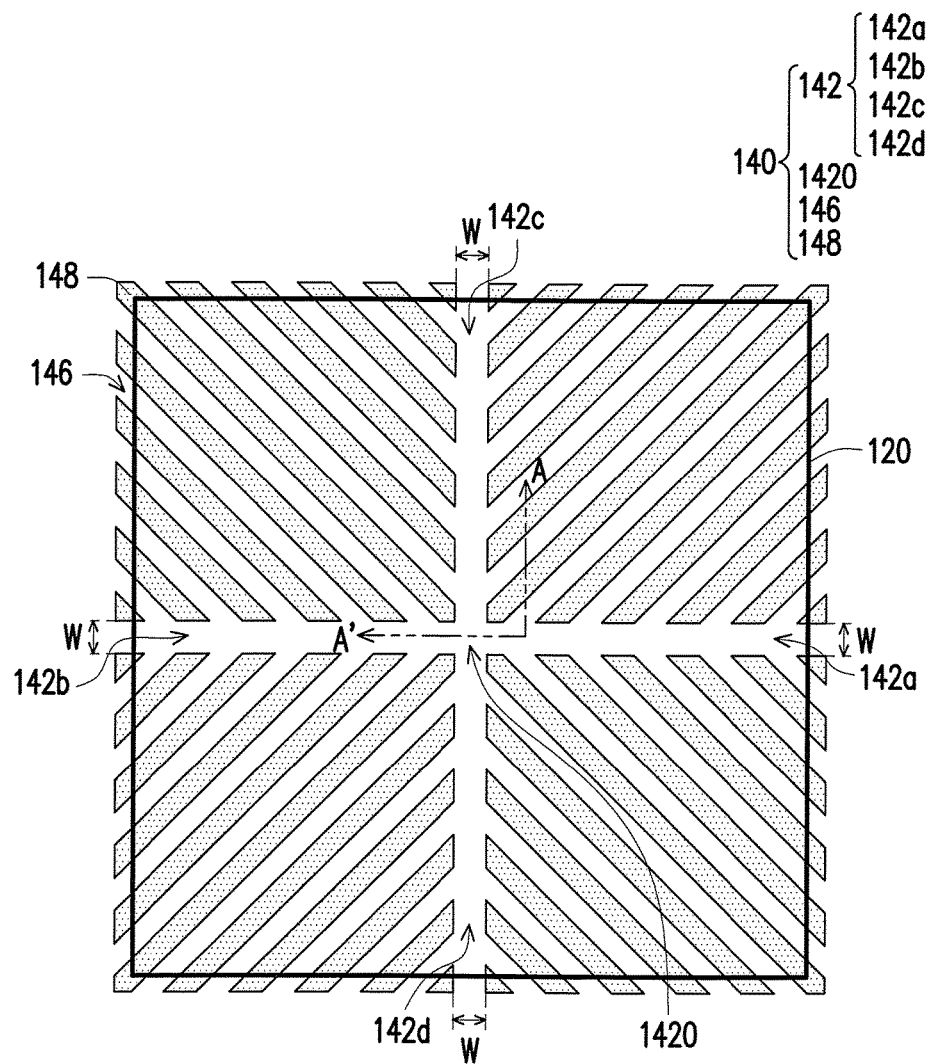
FIG. 3 is a top schematic of a pixel electrode in a pixel structure and a protective layer located below the pixel electrode according to an embodiment of the invention.
Figure 4:
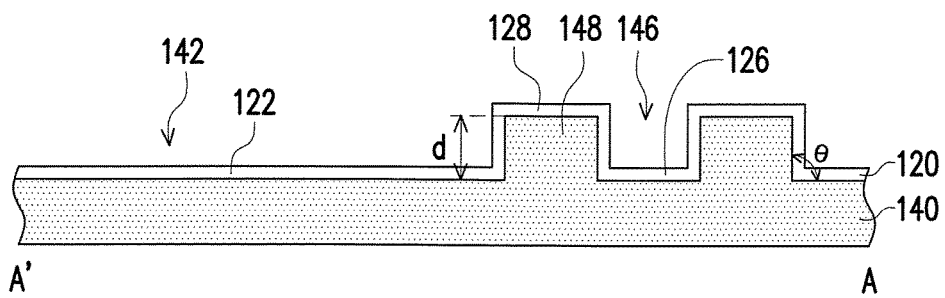
FIG. 4 is a cross-sectional schematic along line A-A' in FIG. 3.

FIG. 3 is a top schematic of a pixel electrode in a pixel structure and a protective layer located below the pixel electrode according to an embodiment of the invention. FIG. 4 is a cross-sectional schematic along line A-A' in FIG. 3. In the present embodiment, the pixel electrode PE of the pixel structure 100 of FIG. 2 is, for instance, the pixel electrode 120 in FIG. 3, and the protective layer not shown in the pixel structure 100 of FIG. 2 is, for instance, a protective layer 140 in FIG. 3.

As shown in FIG. 3, the pixel electrode 120 has at least one block-shaped electrode (also referred to as a plate electrode). More specifically, the pixel electrode 120 of the present embodiment does not have an opening or a hole, a slit, a groove, or a gap. Moreover, the range of the aspect ratio (length:width) of the pixel electrode 120 is about 1:2, preferably about 1:1.

The protective layer 140 is located below the pixel electrode 120, and has a recess main portion 142, a central recess main portion 1420, and a plurality of recess branched portions 146, wherein the central recess main portion 1420, the recess main portion 142, and the plurality of recess branched portions 146 are areas of the portion of the protective layer 140 removed after the protective layer 140 is patterned. Each of the central recess main portion 1420 and the recess main portion 142 has a width W, and the width W is greater than 0 μm and less than or equal to 4 μm, and is preferably about 2 μm. As shown in FIG. 3, the recess main portion 142 has a first horizontal recess main portion 142a, a second horizontal recess main portion 142b, a first vertical recess main portion 142c, and a second vertical recess main portion 142d connected to one another. In the present embodiment, the first horizontal recess main portion 142a, the second horizontal recess main portion 142b, the first vertical recess main portion 142c, and the second vertical recess main portion 142d of the recess main portion 142 all maintain the same width W, but the invention is not limited thereto. In particular, the central recess main portion 1420 and the first horizontal recess main portion 142a and the second horizontal recess main portion 142b of the recess main portion 142 are connected to one another behind the same horizontal line; and the central recess main portion 1420 and the first vertical recess main portion 142c and the second vertical recess main portion 142d of the recess main portion 142 are connected to one another behind the same vertical line. In other embodiments, the first horizontal recess main portion 142a, the second horizontal recess main portion 142b, the first vertical recess main portion 142c, and the second vertical recess main portion 142d have, for instance, different widths W and/or have tapered widths. In addition, the plurality of recess branched portions 146 is extended along at least four directions and connected to the recess main portion 142, and therefore the individual recess branched portions 146 extended along different directions are not directly in contact with one another or connected to one another. In particular, a protruding branched portion 148 (i.e., an area in which the protective layer 140 is not removed after the protective layer 140 is patterned) is between two adjacent recess branched portions 146 and between the recess main portion 142 and any adjacent recess branched portion 146. Via the staggered configuration of the central recess main portion 1420, the recess main portion 142, the recess branched portions 146, and the protruding branched portions 148 of the protective layer 140, the protective layer 140 can have undulating areas.

Referring to both FIG. 3 and FIG. 4, the pixel electrode 120 is formed above the protective layer 140, wherein each of the central recess main portion 1420 and the recess main portion 142 of the protective layer 140 has a depth d, and the depth d is greater than or equal to 0.05 μm and less than or equal to 0.3 μm, and is preferably greater than or equal to about 0.05 μm and less than or equal to about 0.1 μm. It should be mentioned that, the depth of each of the recess branched portions 146 can be adjusted according to design requirement, and the invention does not particularly limit the depth of each of the recess branched portions 146. Specifically, the pixel electrode 120 conformably covers the central recess main portion 1420, the recess main portion 142, the recess branched portions 146, and the protruding branched portions 148 of the protective layer 140, such that the pixel electrode 120 is changed in accordance with the undulating terrain of the protective layer 140 below the pixel electrode 120, such as the central recess main portion 1420, the recess main portion 142, the recess branched portions 146, and the protruding branched portions 148, so that the pixel electrode 120 respectively has a recess main electrode pattern 122, a recess branched electrode pattern 126, and a protruding branched electrode pattern 128. In other words, the undulating areas formed by the staggered configuration of the central recess main portion 1420, the recess main portion 142, the recess branched portions 146, and the protruding branched portions 148 in the protective layer 140 allow the pixel electrode 120 to conformably cover the protective layer 140, such that the pixel electrode 120 also has an undulating electrode contour. Moreover, each of the tapers between the protruding areas and the recess areas of the protective layer 140 has an inclined angle θ, and the inclined angle θ can be in the range of about 45° to about 90°, and is preferably in the range of about 80° to about 90°, so as to alleviate the phenomenon of light leakage in a dark state caused by inclined tapers.

Via the above dispositions of the protective layer and the pixel electrode, in addition to ensuring the display panel of the invention has good transmittance and liquid crystal response time, since the pixel structure of the invention has the desired undulating structure, the phenomenon of unstable liquid crystal reversal can be prevented, thus improving contrast ratio and alleviating the phenomenon of light leakage in a dark state, such that good display effect is achieved.

Figure 5:
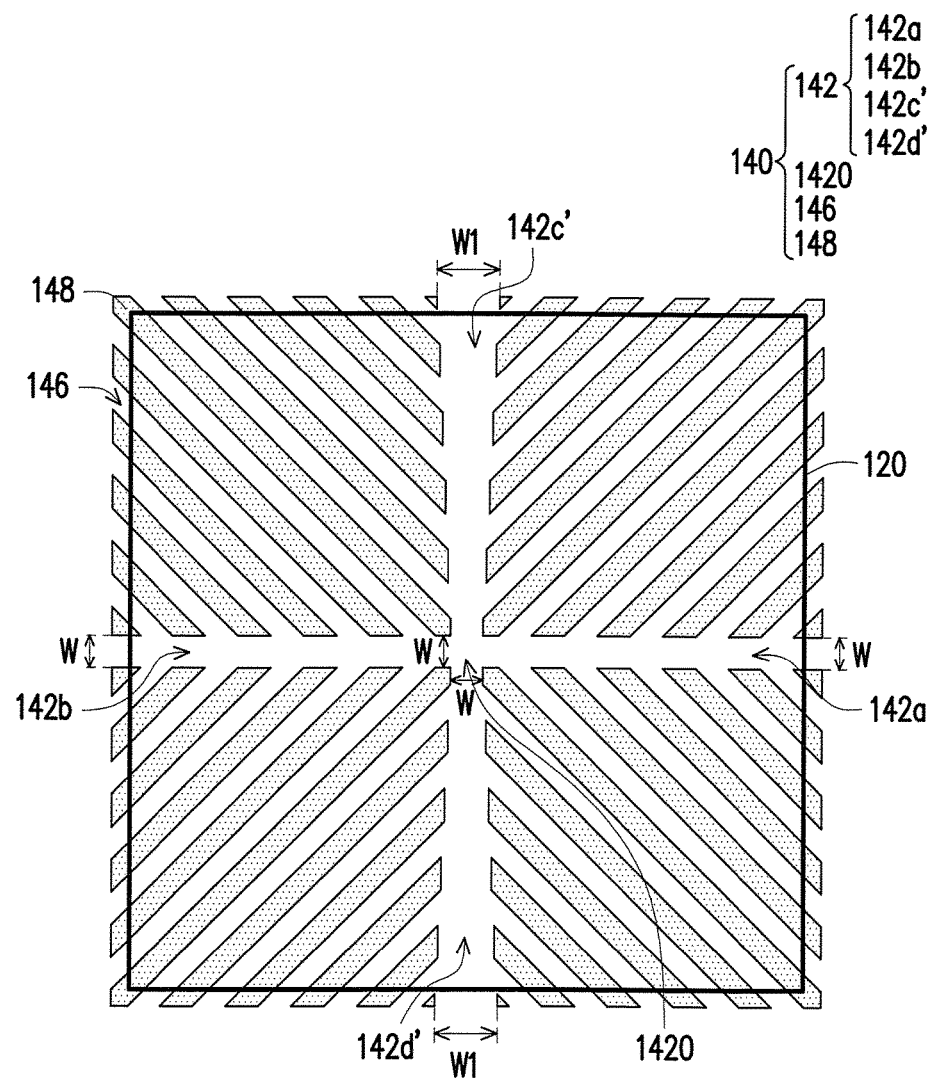
FIG. 5 is a top schematic of a pixel electrode in a pixel structure and a protective layer located below the pixel electrode according to another embodiment of the invention.

FIG. 5 is a top schematic of a pixel electrode in a pixel structure and a protective layer located below the pixel electrode according to another embodiment of the invention. The embodiment of FIG. 5 is similar to the embodiment shown in FIG. 3, and the same or similar elements are represented by the same or similar reference numerals and are not repeated herein. The difference between the embodiment structure of FIG. 5 and the embodiment structure of FIG. 3 is that, the recess main portion 142 in the protective layer 140 of FIG. 5 has a different width. Referring to FIG. 5, the recess main portion 142 has a first horizontal recess main portion 142a, a second horizontal recess main portion 142b, a first vertical recess main portion 142c', and a second vertical recess main portion 142d'. In particular, the first horizontal recess main portion 142a and the second horizontal recess main portion 142b both maintain the same width W, and the width of each of the first vertical recess main portion 142c' and the second vertical recess main portion 142d' is gradually increased along the center of the pixel structure 100 (i.e., the central recess main portion 1420) toward at least one edge. Specifically, in the present embodiment, the center area of the first vertical recess main portion 142c' and the second vertical recess main portion 142d' adjacent to the protective layer 140 (i.e., the central recess main portion 1420) has a width W, and the periphery area of the first vertical recess main portion 142c' and the second vertical recess main portion 142d' adjacent to the protective layer 140 has a width W1 in a direction away from the central recess main portion 1420; wherein the width W1 is greater than the width W, and the widths W and W1 can roughly be within the following ranges: 0 μm<W and W1≤4 μm.

Figure 6:
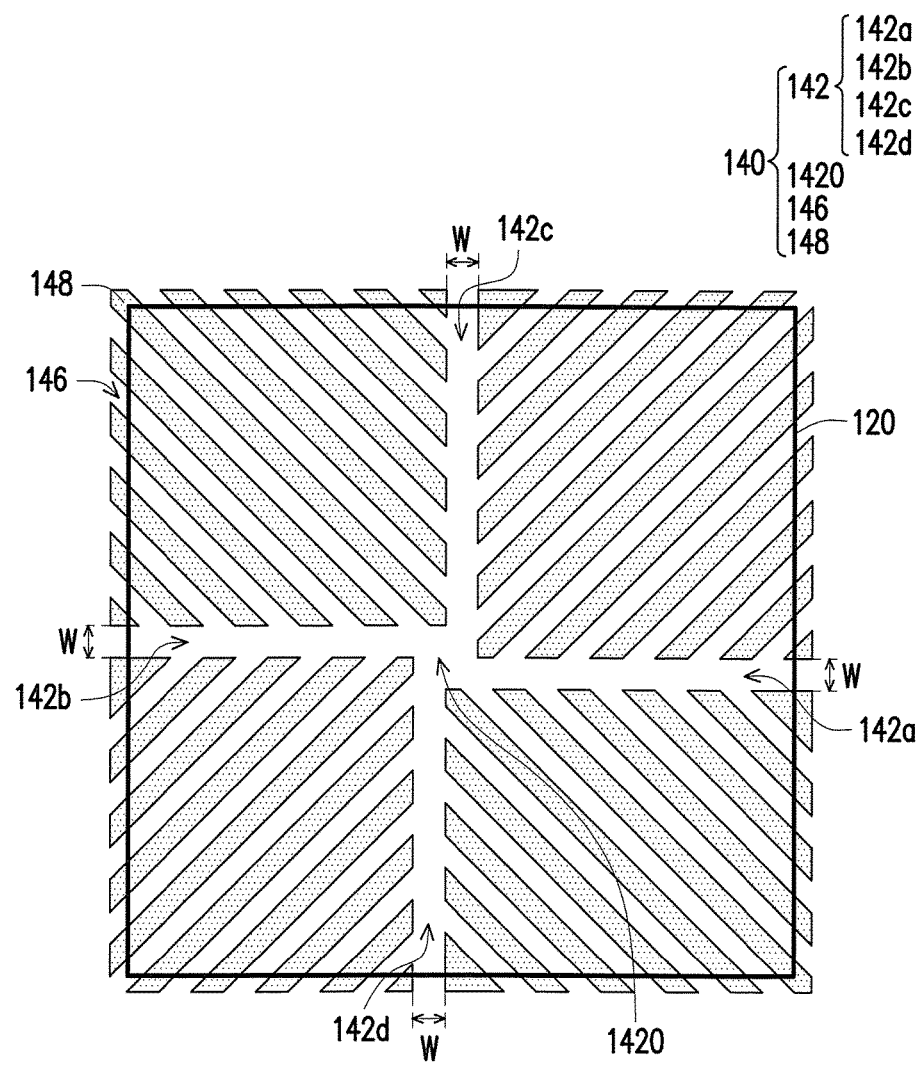
FIG. 6 is a top schematic of a pixel electrode in a pixel structure and a protective layer located below the pixel electrode according to another embodiment of the invention.

FIG. 6 is a top schematic of a pixel electrode in a pixel structure and a protective layer located below the pixel electrode according to an embodiment of the invention. The embodiment of FIG. 6 is similar to the embodiment shown in FIG. 3, and the same or similar elements are represented by the same or similar reference numerals and are not repeated herein. The difference between the embodiment structure of FIG. 6 and the embodiment structure of FIG. 3 is that, the first horizontal recess main portion 142a and the second horizontal recess main portion 142b of the recess main portion 142 in the protective layer 140 of FIG. 6 are not aligned with each other, the first vertical recess main portion 142c and the second vertical recess main portion 142d are also not aligned with each other, and the first horizontal recess main portion 142a, the second horizontal recess main portion 142b, the first vertical recess main portion 142c, and the second vertical recess main portion 142d are respectively connected to the central recess main portion 1420. In other words, the central recess main portion 1420 and the first horizontal recess main portion 142a and the second horizontal recess main portion 142b of the recess main portion 142 are connected to one another without being behind the same horizontal line; and the central recess main portion 1420 and the first vertical recess main portion 142c and the second vertical recess main portion 142d of the recess main portion 142 are connected to one another without being behind the same vertical line.

Figure 7:
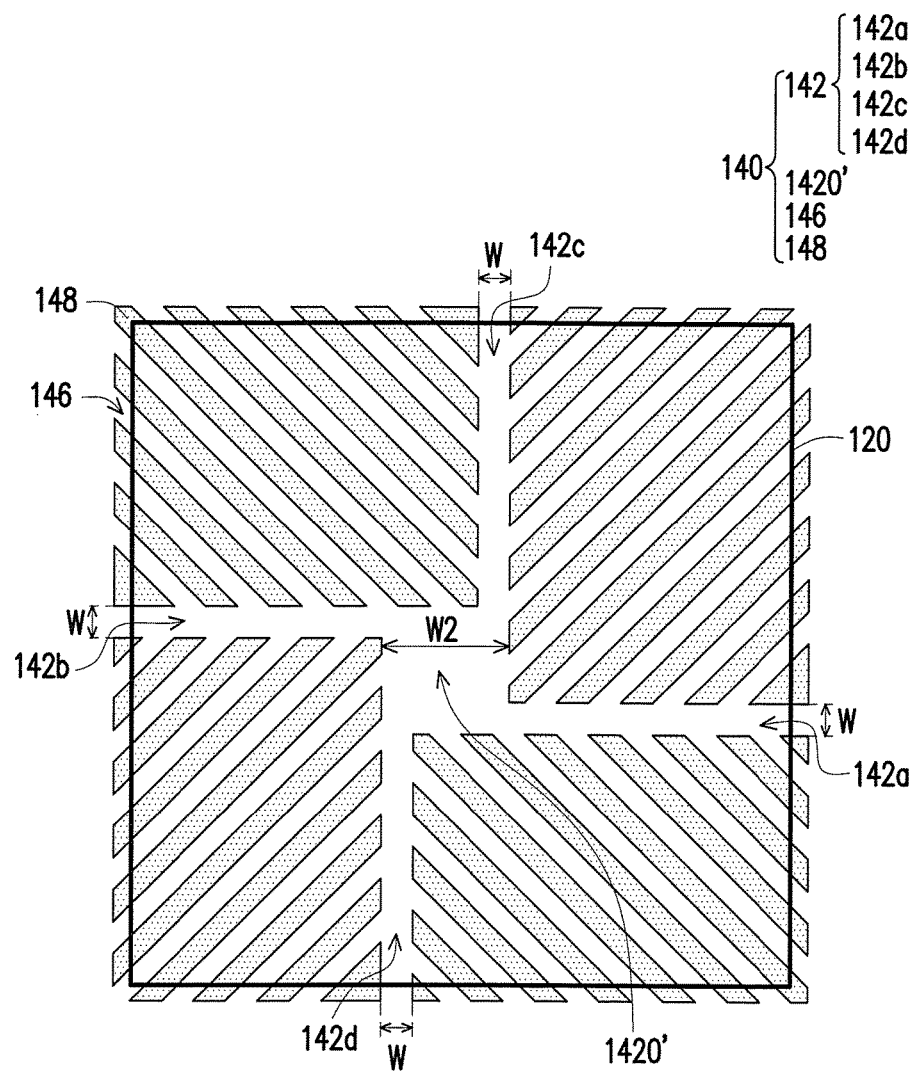
FIG. 7 is a top schematic of a pixel electrode in a pixel structure and a protective layer located below the pixel electrode according to another embodiment of the invention.

FIG. 7 is a top schematic of a pixel electrode in a pixel structure and a protective layer located below the pixel electrode according to an embodiment of the invention. The embodiment of FIG. 7 is similar to the embodiment shown in FIG. 3, and the same or similar elements are represented by the same or similar reference numerals and are not repeated herein. The difference between the embodiment structure of FIG. 7 and the embodiment structure of FIG. 3 is that, a central recess main portion 1420' in the protective layer 140 of FIG. 7 has a width W2, and the first horizontal recess main portion 142a and the second horizontal recess main portion 142b of the recess main portion 142 are not aligned with each other and are connected to the central recess main portion 1420', and the first vertical recess main portion 142e and the second vertical recess main portion 142d are not aligned with each other and are connected to the central recess main portion 1420'; in other words, the central recess main portion 1420', the first horizontal recess main portion 142a of the recess main portion 142, and the second horizontal recess main portion 142b of the recess main portion 142 are not connected to one another behind the same horizontal line; and the central recess main portion 1420', the first vertical recess main portion 142c of the recess main portion 142, and the second vertical recess main portion 142d of the recess main portion 142 are not connected to one another behind the same vertical line. Referring to FIG. 7, the central recess main portion 1420' has a width W2, and each of the first horizontal recess main portion 142a, the second horizontal recess main portion 142b, the first vertical recess main portion 142c, and the second vertical recess main portion 142d has a width W, wherein the width W2 is greater than the width W, and the widths W and W2 can roughly be within the following ranges: 0 μm<W≤4 μm and 2W<W2≤2W+10 μm.

As described above, in each embodiment of FIG. 5 to FIG. 7, the protective layer 140 has undulating areas due to the specific structural disposition of the protective layer 140 in the pixel structure, such that the pixel electrode 120 conformably covering the protective layer 140 has an undulating electrode contour (i.e., the recess main electrode pattern 122, the recess branched electrode pattern 126, and the protruding branched electrode pattern 128). Accordingly, not only can the display panel of the invention be ensured to have good transmittance and liquid crystal response time, the phenomenon of unstable liquid crystal reversal can also be prevented. As a result, contrast ratio can be improved and the phenomenon of light leakage in a dark state can be alleviated to achieve good display effect.

Figure 8:
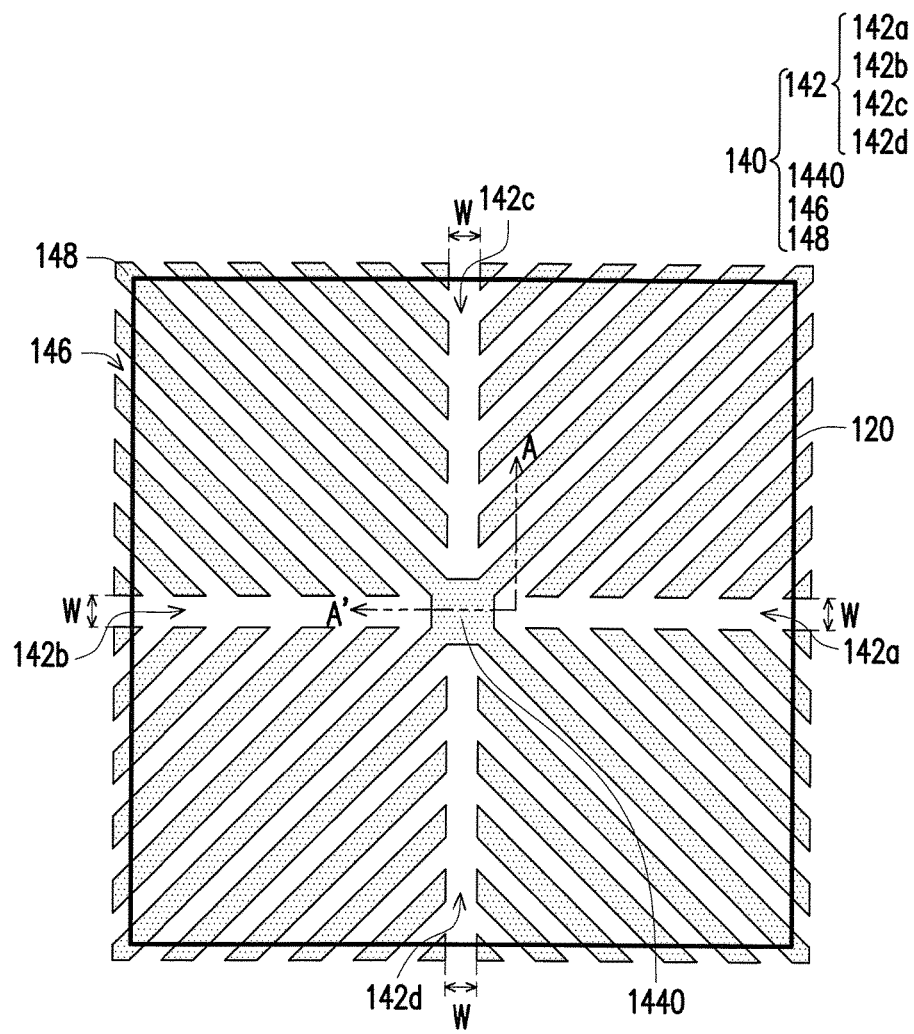
FIG. 8 is a top schematic of a pixel electrode in a pixel structure and a protective layer located below the pixel electrode according to another embodiment of the invention.
Figure 9:
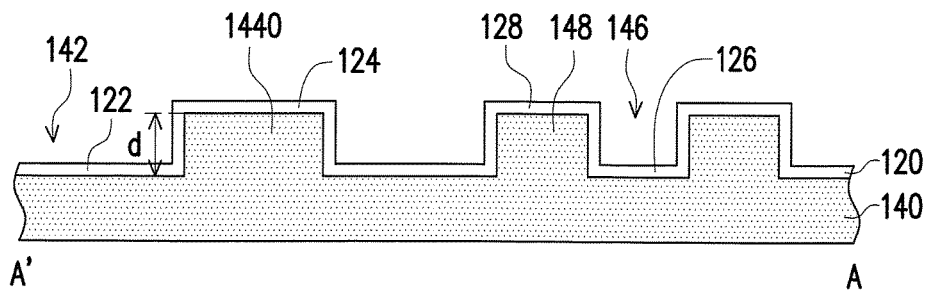
FIG. 9 is a cross-sectional schematic along line A-A' in FIG. 8.

FIG. 8 is a top schematic of a pixel electrode in a pixel structure and a protective layer located below the pixel electrode according to another embodiment of the invention. FIG. 9 is a cross-sectional schematic along line A-A' in FIG.

8. In particular, the embodiment of FIG. 8 is similar to the embodiment shown in FIG. 3, the embodiment of FIG. 8 is similar to the embodiment shown in FIG. 3, and the same or similar elements are represented by the same or similar reference numerals and are not repeated herein. The difference between the embodiment structure of FIG. 8 and the embodiment structure of FIG. 3 is that, the protective layer 140 of FIG. 8 further includes a protruding main portion. Specifically, the central recess main portion 1420 in the protective layer 140 of FIG. 3 is replaced by a central protruding main portion 1440 in the protective layer 140.

Referring to FIG. 8, the protective layer 140 is located below the pixel electrode 120 and has a recess main portion 142, a central protruding main portion 1440, a plurality of recess branched portions 146, and a plurality of protruding branched portions 148. As shown in FIG. 8, the central protruding main portion 1440 is connected to the first horizontal recess main portion 142a, the second horizontal recess main portion 142b, the first vertical recess main portion 142c, and the second vertical recess main portion 142d of the recess main portion 142. In particular, the first horizontal recess main portion 142a, the second horizontal recess main portion 142b, the first vertical recess main portion 142c, and the second vertical recess main portion 142d are respectively extended toward four directions from the central protruding main portion 1440, and the length (not shown) of the recess main portion is, for instance, greater than or equal to one-third the length (not shown) of the central protruding main portion 1440. Moreover, each of the first horizontal recess main portion 142a, the second horizontal recess main portion 142b, the first vertical recess main portion 142c, and the second vertical recess main portion 142d has a width W, and the width W can roughly be within the following range: 0 µm<W≤4 µm, preferably about 2 µm. Via the staggered configuration of the recess main portion 142, the central protruding main portion 1440, the recess branched portions 146, and the protruding branched portions 148 of the protective layer 140, the protective layer 140 can have undulating areas.

Referring to both FIG. 8 and FIG. 9, the pixel electrode 120 is formed above the protective layer 140, wherein the recess main portion 142 of the protective layer 140 has a depth d. The depth d of the recess main portion 142 is greater than or equal to 0.05 µm and less than or equal to 0.3 µm, and is preferably greater than or equal to about 0.05 µm and less than or equal to about 0.1 µm. More specifically, the pixel electrode 120 conformably covers the protective layer 140 having undulating areas, such that the pixel electrode 120 is recessed in accordance with the recess main portion 142 and the recess branched portions 146 and the pixel electrode 120 is protruded in accordance with the central protruding main portion 1440 and the protruding branched portions 148, so that the pixel electrode 120 has a recess main electrode pattern 122, a recess branched electrode pattern 126, a protruding main electrode pattern 124, and a protruding branched electrode pattern 128. In other words, the undulating areas formed by the staggered configuration of the recess main portion 142, the central protruding main portion 1440, the recess branched portions 146, and the protruding branched portions 148 of the protective layer 140 allow the pixel electrode 120 to conformably cover the protective layer 140, such that the pixel electrode 120 has an undulating electrode contour. Via the above disposition of the protective layer and the pixel electrode, in addition to ensuring the display panel of the invention has good transmittance and liquid crystal response time, since the pixel structure of the invention has the desired undulating structure, the phenomenon of unstable liquid crystal reversal can be prevented, thus improving contrast ratio and alleviating the phenomenon of light leakage in a dark state, and as a result good display effect can be achieved.

Figure 10:
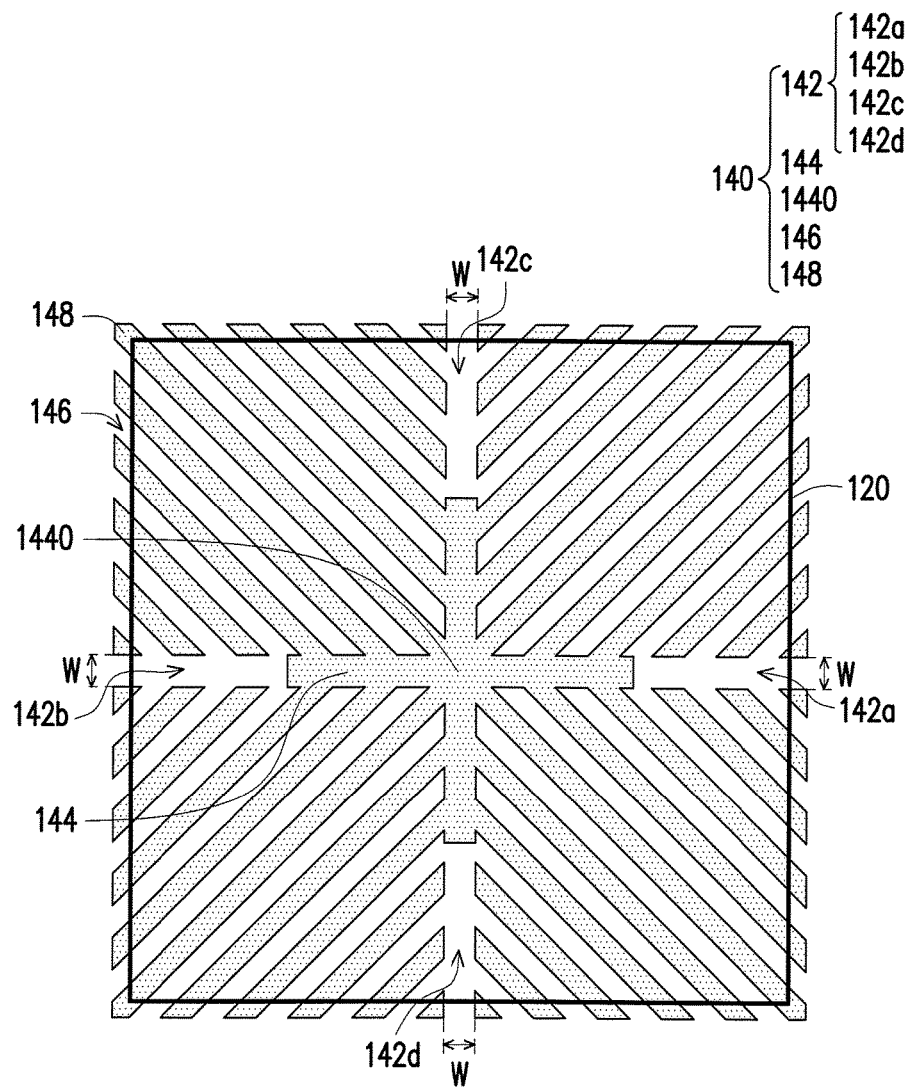
FIG. 10 is a top schematic of a pixel electrode in a pixel structure and a protective layer located below the pixel electrode according to another embodiment of the invention.

FIG. 10 is a top schematic of a pixel electrode in a pixel structure and a protective layer located below the pixel electrode according to another embodiment of the invention. The embodiment of FIG. 10 is similar to the embodiment shown in FIG. 8, and the same or similar elements are represented by the same or similar reference numerals and are not repeated herein. The difference between the embodiment structure of FIG. 10 and the embodiment structure of FIG. 8 is that, the protective layer 140 of FIG. 10 further includes a protruding main portion 144.

Referring to FIG. 10, the protective layer 140 has a recess main portion 142, a protruding main portion 144, a central protruding main portion 1440, a plurality of recess branched portions 146, and a plurality of protruding branched portions 148. As shown in FIG. 10, the central protruding main portion 1440 is connected to the protruding main portion 144, and the protruding main portion 144 is respectively extended toward four directions from the central protruding main portion 1440, and is respectively connected to the first horizontal recess main portion 142a, the second horizontal recess main portion 142b, the first vertical recess main portion 142c, and the second vertical recess main portion 142d of the recess main portion 142. Specifically, the pixel electrode 120 conformably covers the recess main portion 142, the protruding main portion 144, the central protruding main portion 1440, the plurality of recess branched portions 146, and the plurality of protruding branched portions 148 of the protective layer 140, such that the pixel electrode 120 is recessed in accordance with the recess main portion 142 and the recess branched portions 146 and the pixel electrode 120 is protruded in accordance with the protruding main portion 144, the central protruding main portion 1440, and the protruding branched portions 148, so that the pixel electrode 120 has a recess main electrode pattern 122, a recess branched electrode pattern 126, a protruding main electrode pattern 124, and a protruding branched electrode pattern 128. In the present embodiment, the protruding main electrode pattern 124 is located in the center of the pixel electrode 120. Therefore, the undulating areas formed by the staggered configuration of the recess main portion 142, the protruding main portion 144, the central protruding main portion 1440, the recess branched portions 146, and the protruding branched portions 148 of the protective layer 140 and the pixel electrode 120 conformably covering the protective layer 140 allow the pixel electrode 120 to have an undulating electrode contour (i.e., the recess main electrode pattern 122, the recess branched electrode pattern 126, the protruding main electrode pattern 124, and the protruding branched electrode pattern 128).

Figure 11:
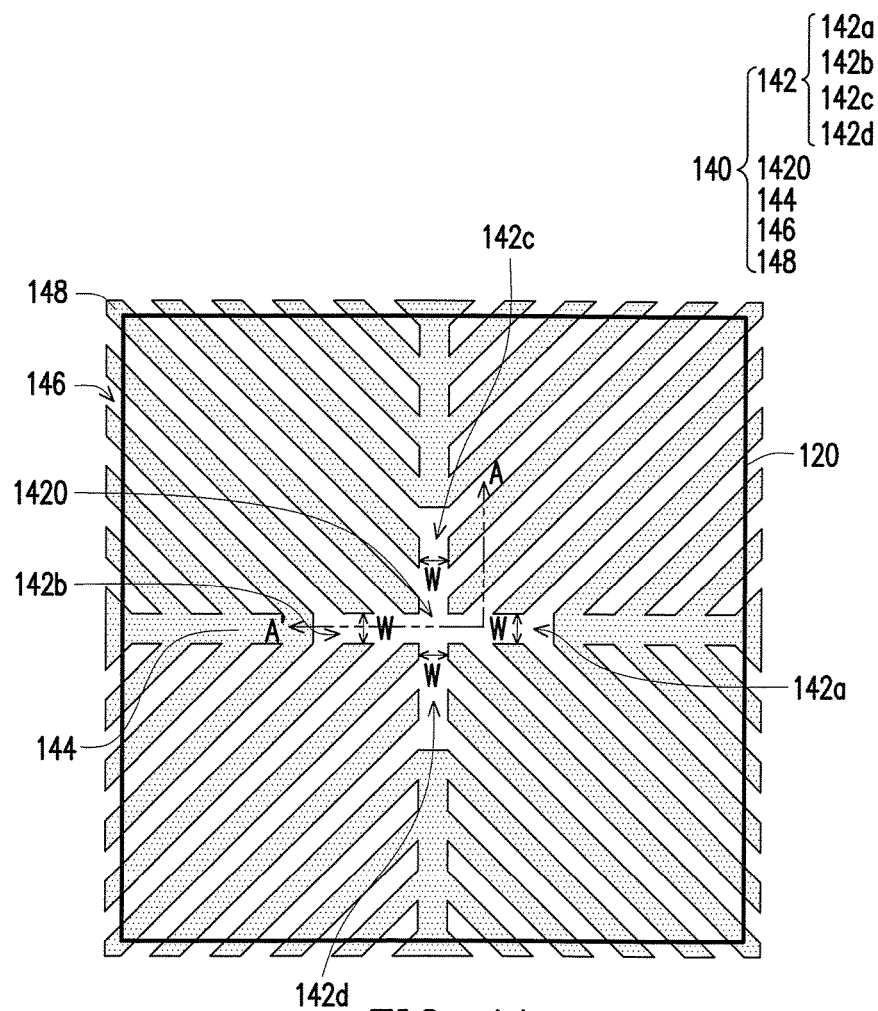
FIG. 11 is a top schematic of a pixel electrode in a pixel structure and a protective layer located below the pixel electrode according to another embodiment of the invention.
Figure 12:
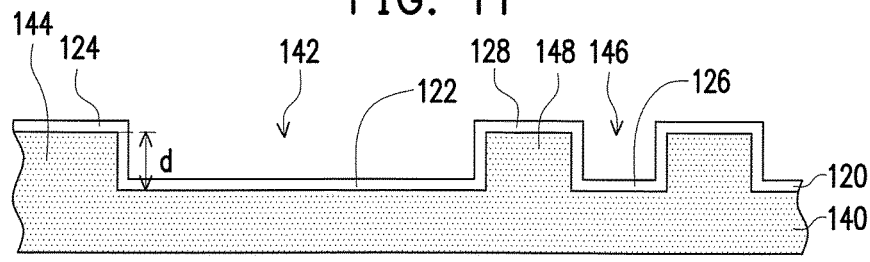
FIG. 12 is a cross-sectional schematic along line A-A' in FIG. 11.

FIG. 11 is a top schematic of a pixel electrode in a pixel structure and a protective layer located below the pixel electrode according to another embodiment of the invention. FIG. 12 is a cross-sectional schematic along line A-A' in FIG. 11. In particular, the embodiment of FIG. 11 is similar to the embodiment shown in FIG. 3, the embodiment of FIG. 11 is similar to the embodiment shown in FIG. 3, and the same or similar elements are represented by the same or similar reference numerals and are not repeated herein. The difference between the embodiment structure of FIG. 11 and the embodiment structure of FIG. 3 is that, the protective layer 140 of FIG. 11 further includes a protruding main portion 144.

Referring to FIG. 11, the protective layer 140 is located below the pixel electrode 120 and has a recess main portion 142, a central recess main portion 1420, a protruding main portion 144, a plurality of recess branched portions 146, and a plurality of protruding branched portions 148. Each of the central recess main portion 1420 and the recess main portion 142 has a width W, and the width W is greater than 0 μm and less than or equal to 4 μm, and is preferably about 2 μm. As shown in FIG. 11, the central recess main portion 1420 is connected to the recess main portion 142, and the first horizontal recess main portion 142a, the second horizontal recess main portion 142b, the first vertical recess main portion 142c, and the second vertical recess main portion 142d of the recess main portion 142 are respectively extended toward four directions from the central recess main portion 1420 and connected to the protruding main portion 144. In the present embodiment, the length of each of the vertical and horizontal recess main portions 142a to 142d is, for instance, about half the length of the protruding main portion 144, but the invention is not limited thereto. In other embodiments, the length of the recess main portion 142 only needs to be greater than or equal to one-third the length of the protruding main portion 144. Specifically, via the staggered configuration of the recess main portion 142, the central recess main portion 1420, the protruding main portion 144, the recess branched portions 146, and the protruding branched portions 148 of the protective layer 140, the protective layer 140 can have undulating areas.

Referring to both FIG. 11 and FIG. 12, the pixel electrode 120 is formed above the protective layer 140, wherein each of the recess main portion 142 and the central recess main portion 1420 of the protective layer 140 has a depth d. The depth d of each of the recess main portion 142 and the central recess main portion 1420 is greater than or equal to 0.05 μm and less than or equal to 0.3 μm, and is preferably greater than or equal to about 0.05 μm and less than or equal to about 0.1 μm. Specifically, the pixel electrode 120 conformably covers the recess main portion 142, the central recess main portion 1420, the protruding main portion 144, the plurality of recess branched portions 146, and the plurality of protruding branched portions 148 of the protective layer 140, such that the pixel electrode 120 is recessed in accordance with the recess main portion 142, the central recess main portion 1420, and the recess branched portions 146 and the pixel electrode 120 is protruded in accordance with the protruding main portion 144 and the protruding branched portions 148, so that the pixel electrode 120 has a recess main electrode pattern 122, a recess branched electrode pattern 126, a protruding main electrode pattern 124, and a protruding branched electrode pattern 128. In particular, the recess main electrode pattern 122 is located in the center of the pixel electrode 120. In other words, the undulating areas formed by the staggered configuration of the recess main portion 142, the central recess main portion 1420, the recess branched portions 146, the protruding main portion 144, and the protruding branched portions 148 of the protective layer 140 allow the pixel electrode 120 to conformably cover the protective layer 140, such that the pixel electrode 120 has an undulating electrode contour. Via the above dispositions of the protective layer and the pixel electrode, in addition to ensuring the display panel of the invention has good transmittance and liquid crystal response time, since the pixel structure of the invention has the desired undulating structure, the phenomenon of unstable liquid crystal reversal can be prevented, thus improving contrast ratio and alleviating the phenomenon of light leakage in a dark state, and as a result good display effect can be achieved.

Figure 13:
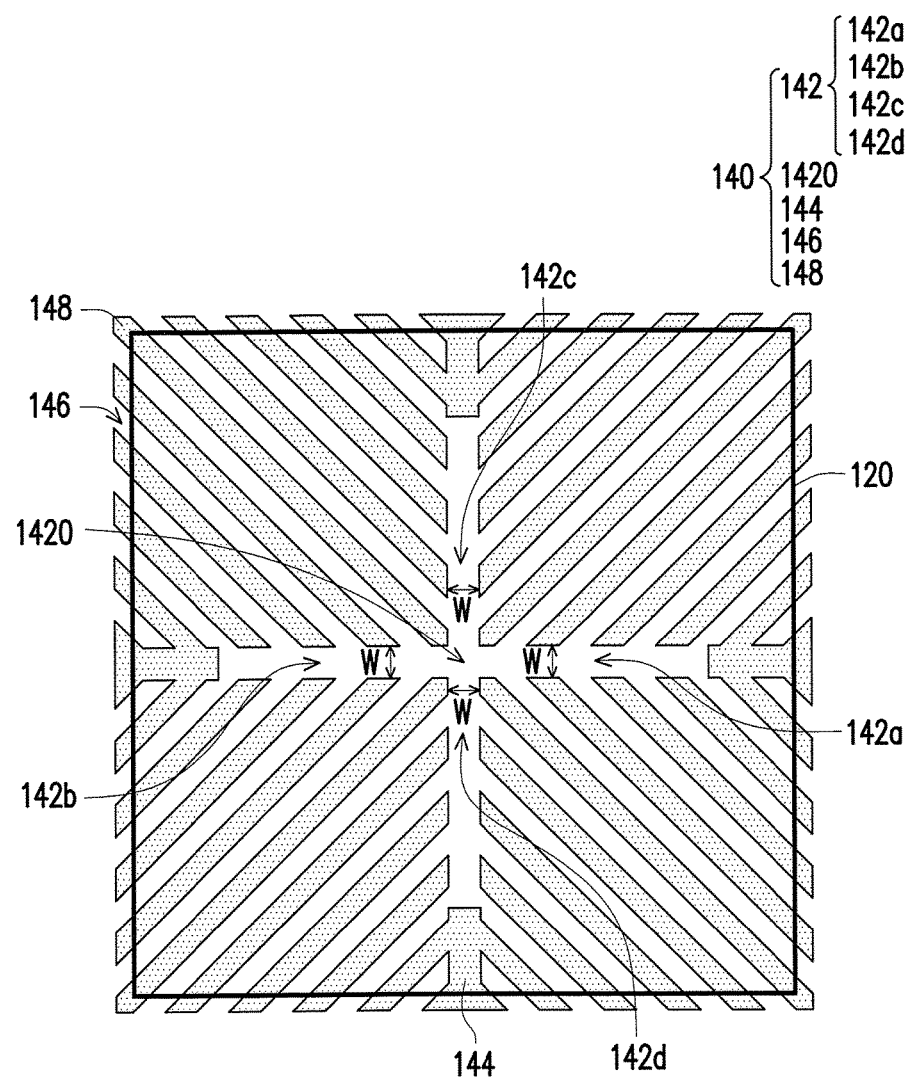
FIG. 13 is a top schematic of a pixel electrode in a pixel structure and a protective layer located below the pixel electrode according to another embodiment of the invention.

FIG. 13 is a top schematic of a pixel electrode in a pixel structure and a protective layer located below the pixel electrode according to another embodiment of the invention. The embodiment of FIG. 13 is similar to the embodiment shown in FIG. 11, and the same or similar elements are represented by the same or similar reference numerals and are not repeated herein. The difference between the embodiment structure of FIG. 13 and the embodiment structure of FIG. 11 is that, the length of each of the vertical and horizontal recess main portions 142a to 142d in the protective layer 140 of FIG. 13 is, for instance, greater than one-third the length of the protruding main portion 144.

Referring to FIG. 13, the protective layer 140 has a recess main portion 142, a central recess main portion 1420, a protruding main portion 144, a plurality of recess branched portions 146, and a plurality of protruding branched portions 148. Each of the central recess main portion 1420 and the recess main portion 142 of the protective layer 140 has a depth d, and the depth d is greater than or equal to 0.05 μm and less than or equal to 0.3 μm, and is preferably greater than or equal to about 0.05 μm and less than or equal to about 0.1 μm; and each of the central recess main portion 1420 and the recess main portion 142 has a width W, and the width W is greater than 0 μm and less than or equal to 4 μm, and is preferably 2 μm. As shown in FIG. 13, the central recess main portion 1420 is connected to the recess main portion 142, and the first horizontal recess main portion 142a, the second horizontal recess main portion 142b, the first vertical recess main portion 142c, and the second vertical recess main portion 142d of the recess main portion 142 are respectively extended toward four directions from the central recess main portion 1420 and connected to the protruding main portion 144. Specifically, the pixel electrode 120 conformably covers the recess main portion 142, the central recess main portion 1420, the protruding main portion 144, the plurality of recess branched portions 146, and the plurality of protruding branched portions 148 of the protective layer 140, such that the pixel electrode 120 is recessed in accordance with the recess main portion 142, the central recess main portion 1420, and the recess branched portions 146 and the pixel electrode 120 is protruded in accordance with the protruding main portion 144 and the protruding branched portions 148, so that the pixel electrode 120 has a recess main electrode pattern 122, a recess branched electrode pattern 126, a protruding main electrode pattern 124, and a protruding branched electrode pattern 128. In particular, the recess main electrode pattern 122 is located in the center of the pixel electrode 120. In other words, the undulating areas formed by the staggered configuration of the recess main portion 142, the central recess main portion 1420, the protruding main portion 144, the recess branched portions 146, and the protruding branched portions 148 of the protective layer 140 and the pixel electrode 120 conformably covering the protective layer 140 allow the pixel electrode 120 to have an undulating electrode contour (i.e., the recess main electrode pattern 122, the protruding main electrode pattern 124, the recess branched electrode pattern 126, and the protruding branched electrode pattern 128).

Figure 14:
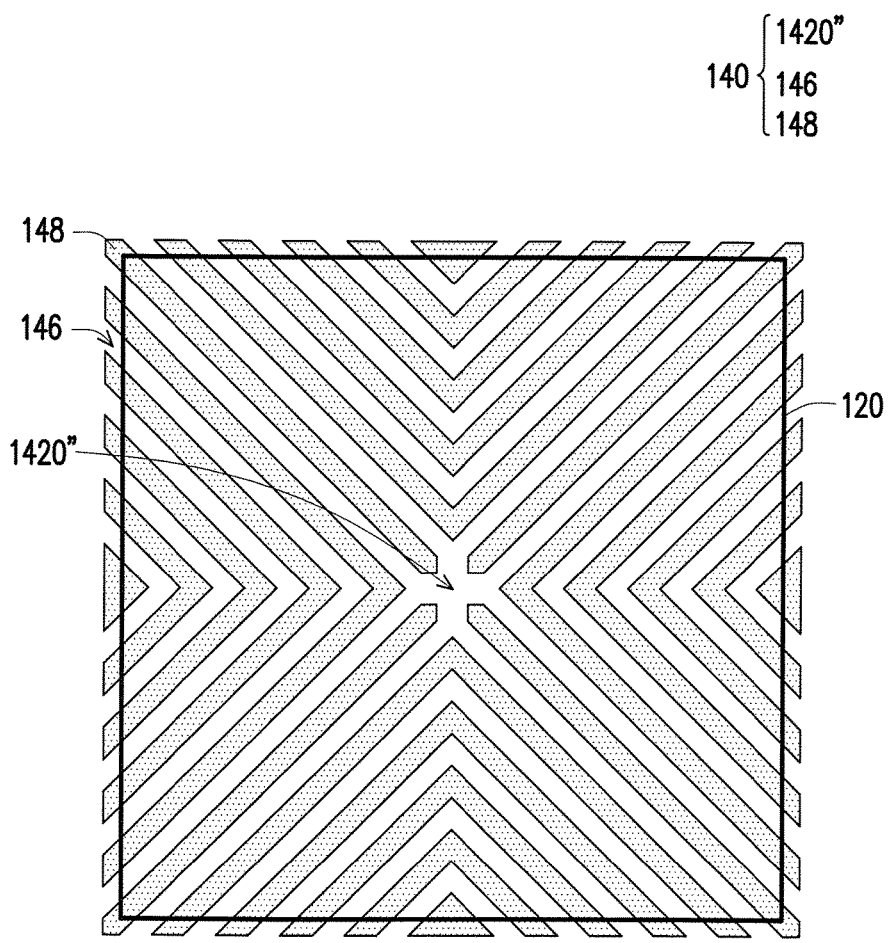
FIG. 14 is a top schematic of a pixel electrode in a pixel structure and a protective layer located below the pixel electrode according to another embodiment of the invention.

FIG. 14 is a top schematic of a pixel electrode in a pixel structure and a protective layer located below the pixel electrode according to another embodiment of the invention. In particular, the embodiment of FIG. 14 is similar to the embodiment shown in FIG. 3, the embodiment of FIG. 14 is similar to the embodiment shown in FIG. 3, and the same or similar elements are represented by the same or similar reference numerals and are not repeated herein. The difference between the embodiment structure of FIG. 14 and the embodiment structure of FIG. 3 is that, the recess main portion 142 and the central recess main portion 1420 in the protective layer 140 of FIG. 3 are replaced by a central recess main portion 1420" in the protective layer 140 of FIG. 14, and a portion of the recess branched portions 146 extended along different directions can be in contact with one another and connected to one another via the central recess main portion 1420".

Referring to FIG. 14, the protective layer 140 is located below the pixel electrode 120 and has a central recess main portion 1420", a plurality of recess branched portions 146, and a plurality of protruding branched portions 148. The central recess main portion 1420" of the protective layer 140 has a depth d, and the depth d is greater than or equal to 0.05 µm and less than or equal to 0.3 µm, and is preferably greater than or equal to about 0.05 µm and less than or equal to about 0.1 µm. As shown in FIG. 14, the central recess main portion 1420" and the recess branched portions 146 closest to the central recess main portion 1420" (i.e., a portion of the recess branched portions 146 closest to the center of the protective layer 140) are connected, and two adjacent recess branched portions 146 of the rest of the recess branched portions 146 extended along different directions can directly be in contact with one another and connected to one another. Moreover, the plurality of recess branched portions 146 is, for instance, extended along at least four directions, wherein a protruding branched portion 148 is between two adjacent recess branched portions 146 extended along the same direction. Via the staggered configuration of the central recess main portion 1420", the recess branched portions 146, and the protruding branched portions 148 of the protective layer 140, the protective layer 140 can have undulating areas, such that the pixel electrode 120 conformably covering the protective layer 140 has an undulating electrode contour. Specifically, the pixel electrode 120 conformably covers the central recess main portion 1420", the recess branched portions 146, and the protruding branched portions 148 of the protective layer 140, and as a result, not only is the pixel electrode 120 recessed in accordance with the central recess main portion 1420" and the recess branched portions 146 and the pixel electrode 120 protruded in accordance with the protruding branched portions 148, the pixel electrode 120 also respectively has a recess main electrode pattern 122, a recess branched electrode pattern 126, and a protruding branched electrode pattern 128. In particular, the recess main electrode pattern 122 is located in the center of the pixel electrode 120. Via the above dispositions of the protective layer and the pixel electrode, in addition to ensuring the display panel of the invention has good transmittance and liquid crystal response time, since the pixel structure of the invention has the desired undulating structure, the phenomenon of unstable liquid crystal reversal can be prevented, thus improving contrast ratio and alleviating the phenomenon of light leakage in a dark state, and as a result good display effect can be achieved.

Figure 15:
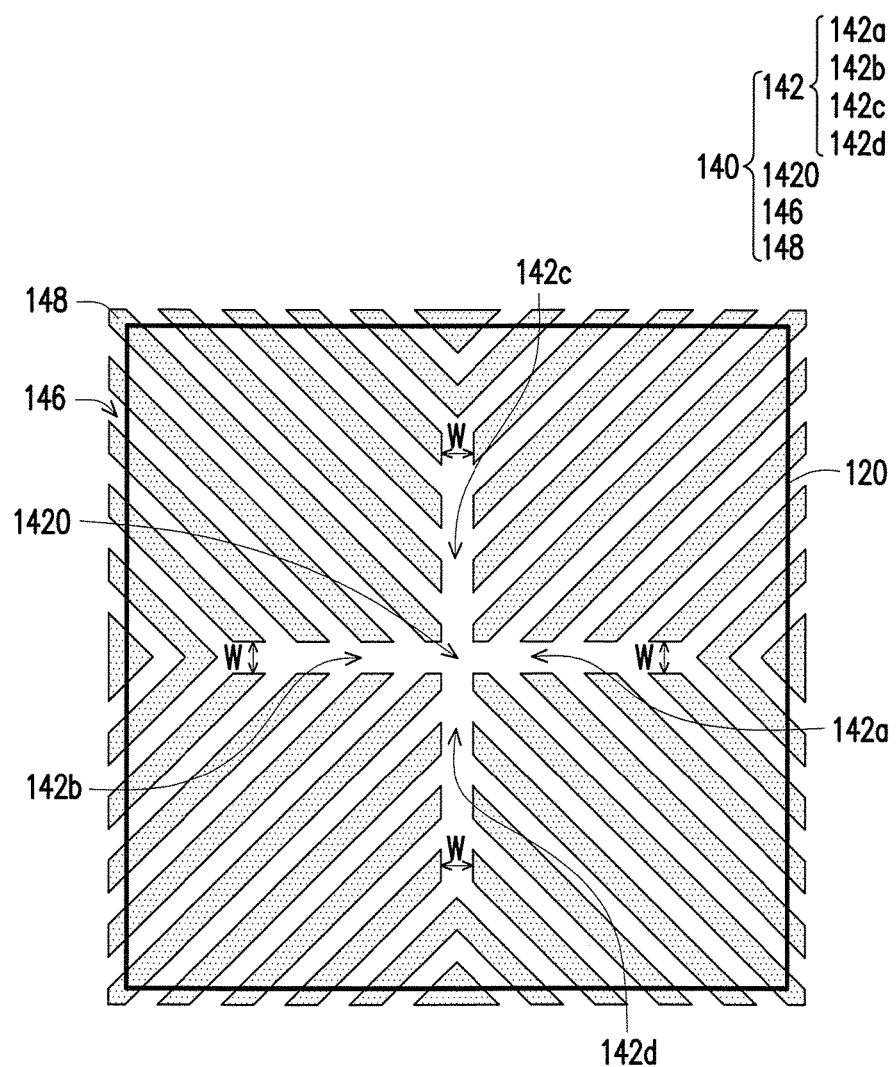
FIG. 15 is a top schematic of a pixel electrode in a pixel structure and a protective layer located below the pixel electrode according to another embodiment of the invention.

FIG. 15 is a top schematic of a pixel electrode in a pixel structure and a protective layer located below the pixel electrode according to another embodiment of the invention. In particular, the embodiment of FIG. 15 is similar to the embodiment shown in FIG. 3, the embodiment of FIG. 15 is similar to the embodiment shown in FIG. 3, and the same or similar elements are represented by the same or similar reference numerals and are not repeated herein. The difference between the embodiment structure of FIG. 15 and the embodiment structure of FIG. 3 is that, a portion of the recess branched portions 146 extended along different directions can be in contact with one another and connected to one another via the recess main portion 142 and the central recess main portion 1420.

Referring to FIG. 15, the protective layer 140 is located below the pixel electrode 120 and has a recess main portion 142, a central recess main portion 1420, a plurality of recess branched portions 146, and a plurality of protruding branched portions 148. Each of the central recess main portion 1420 and the recess main portion 142 of the protective layer 140 has a depth d, and the depth d is greater than or equal to 0.05 µm and less than or equal to 0.3 µm, and is preferably greater than or equal to about 0.05 µm and less than or equal to about 0.1 µm; and each of the central recess main portion 1420 and the recess main portion 142 has a width W, and the width W is greater than 0 µm and less than or equal to 4 µm, and is preferably about 2 µm. As shown in FIG. 15, the central recess main portion 1420 is connected to the first horizontal recess main portion 142a, the second horizontal recess main portion 142b, the first vertical recess main portion 142c, and the second vertical recess main portion 142d of the recess main portion 142. Moreover, the plurality of recess branched portions 146 is extended along at least four directions, wherein a protruding branched portion 148 is between two adjacent recess branched portions 146 extended along the same direction.

As shown in FIG. 15, the central recess main portion 1420 and the recess main portion 142 are connected to the recess branched portion 146 closest to the central recess main portion 1420 and the recess main portion 142. Moreover, the portion of the recess branched portions 146 closest to the periphery area of the protective layer 140 is not connected to the central recess main portion 1420 and the recess main portion 142, and two adjacent recess branched portions 146 extended along different directions can directly be in contact with one another and connected to one another. Therefore, the recess branched portions 146 connected to the central recess main portion 1420 and the recess main portion 142 are not directly in contact with one another or connected to one another, and a protruding branched portion 148 is between two adjacent recess branched portions 146 and between the recess main portion 142 and any adjacent recess branched portion 146. In particular, the pixel electrode 120 conformably covers the recess main portion 142, the central recess main portion 1420, the recess branched portions 146, and the protruding branched portions 148 of the protective layer 140, such that the pixel electrode 120 is recessed in accordance with the recess main portion 142, the central recess main portion 1420, and the recess branched portions 146 and the pixel electrode 120 is protruded in accordance with the protruding branched portions 148, so that the pixel electrode 120 respectively has a recess main electrode pattern 122, a recess branched electrode pattern 126, and a protruding branched electrode pattern 128. In particular, the recess main electrode pattern 122 is located in the center of the pixel electrode 120. Via the staggered configuration of the recess main portion 142, the central recess main portion 1420, the recess branched portions 146, and the protruding branched portions 148 of the protective layer 140, the protective layer 140 can have undulating areas, such that the pixel electrode 120 conformably covering the protective layer 140 has an undulating electrode contour (i.e., the recess main electrode pattern 122, the recess branched electrode pattern 126, and the protruding branched electrode pattern 128). As described above, via the specific structural disposition of the protective layer 140 in the pixel structure 100, the protective layer 140 has undulating areas, such that the pixel electrode 120 conformably covering the protective layer 140 has an undulating electrode contour. Accordingly, not only can the display panel of the invention be ensured to have good transmittance and liquid crystal response time, the phenomenon of unstable liquid crystal reversal can also be prevented. As a result, contrast ratio can be improved and the phenomenon of light leakage in a dark state can be alleviated to achieve good display effect.

Figure 16:
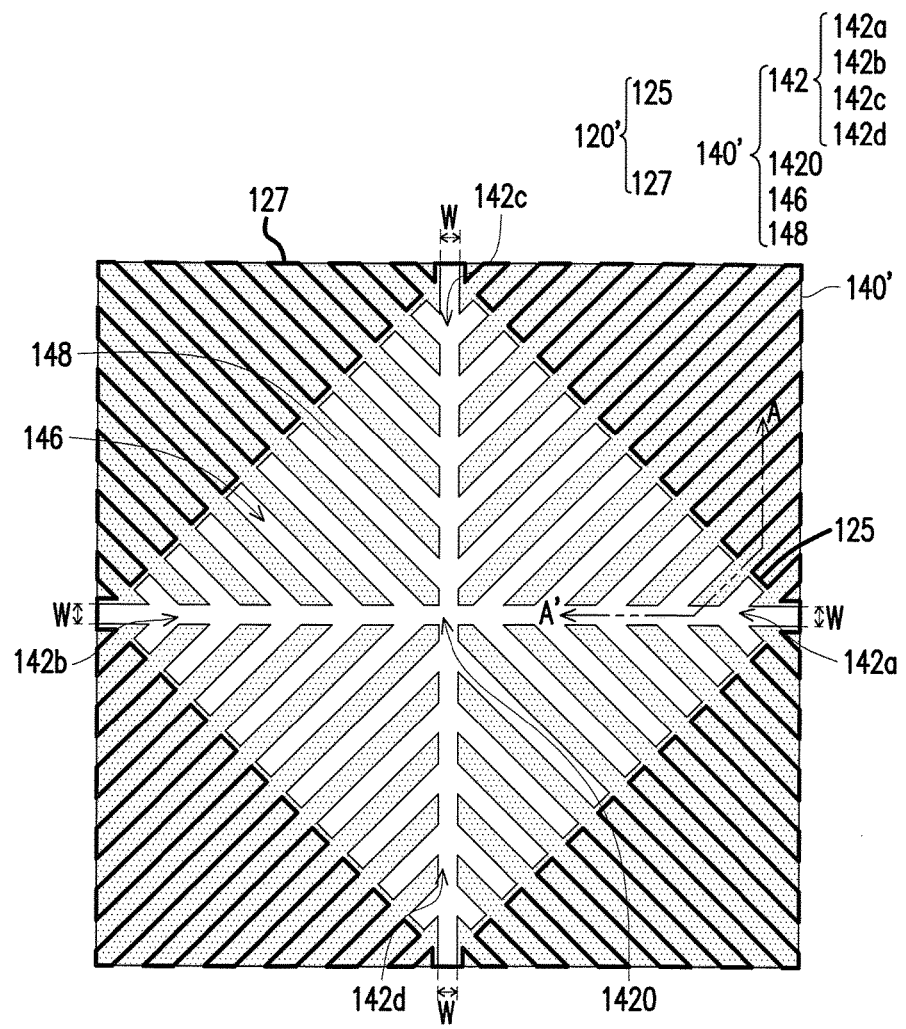
FIG. 16 is a top schematic of a pixel electrode in a pixel structure and a protective layer located below the pixel electrode according to another embodiment of the invention.
Figure 17:
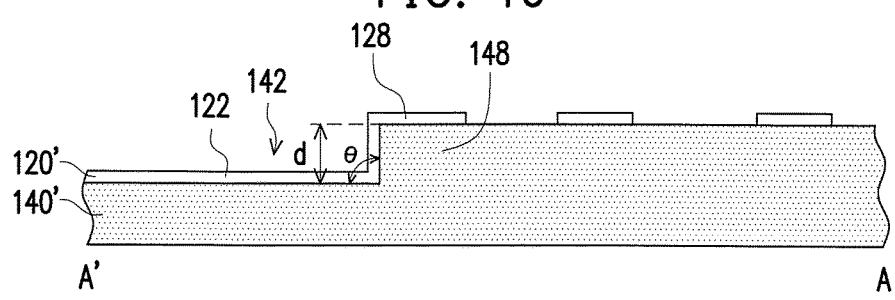
FIG. 17 is a cross-sectional schematic along line A-A' in FIG. 16.

FIG. 16 is a top schematic of a pixel electrode in a pixel structure and a protective layer located below the pixel electrode according to another embodiment of the invention. FIG. 17 is a cross-sectional schematic along line A-A' in FIG. 16. Referring first to FIG. 16, the pixel electrode 120 has a plurality of outer branched electrodes 127 and block-shaped electrodes 125, wherein the block-shaped electrodes 125 are located in the center of a pixel electrode 120', and the plurality of outer branched electrodes 127 is located in the periphery of the block-shaped electrodes 125 and connected to the block-shaped electrodes 125; and the protective layer 140' has a recess main portion 142, a central recess main portion 1420, recess branched portions 146, and protruding branched portions 148, wherein the recess main portion 142 has a first horizontal recess main portion 142$a$, a second horizontal recess main portion 142$b$, a first vertical recess main portion 142$c$, and a second vertical recess main portion 142$d$ connected to one another. Detailed structures of the pixel electrode 120 and the protective layer 140' are described later.

Referring to FIG. 16 to FIG. 17, the pixel electrode 120' is formed above the protective layer 140', wherein the block-shaped electrodes 125 of the pixel electrode 120' are disposed corresponding to the areas in which the recess main portion 142, the central recess main portion 1420, the recess branched portions 146, and the protruding branched portions 148 of the protective layer 140' are located, and each of the outer branched electrodes 127 of the pixel electrode 120' is disposed corresponding to the direction of extension of the protruding branched portions 148 of the protective layer 140' (i.e., the direction of extension from the center of the pixel structure 100 toward an edge thereof). In other words, the outer branched electrodes 127 of the pixel electrode 120' are not overlapped with the protruding branched portions 148 of the protective layer 140'. In particular, each of the central recess main portion 1420 and the recess main portion 142 of the protective layer 140' has a depth d, and the depth d is greater than or equal to 0.05 μm and less than or equal to 0.3 μm, and is preferably greater than or equal to about 0.05 μm and less than or equal to about 0.1 μm. It should be mentioned that, the depth of each of the recess branched portions 146 can be adjusted according to design requirement, and the invention does not particularly limit the depth of each of the recess branched portions 146. Specifically, the block-shaped electrodes 125 of the pixel electrode 120' conformably cover the recess main portion 142, the central recess main portion 1420, the recess branched portions 146, and the protruding branched portions 148 of the protective layer 140', such that the pixel electrode 120' is recessed in accordance with the recess main portion 142, the central recess main portion 1420, and the recess branched portions 146 and the pixel electrode 120' is protruded in accordance with the protruding branched portions 148, so that the pixel electrode 120' respectively has a recess main electrode pattern 122, a recess branched electrode pattern 126, and a protruding branched electrode pattern 128. In other words, via the undulating areas from the staggered configuration of the recess main portion 142, the central recess main portion 1420, the recess branched portions 146, and the protruding branched portions 148 of the protective layer 140', the pixel electrode 120' conformably covering the protective layer 140' also has an undulating electrode contour (i.e., the recess main electrode pattern 122, the recess branched electrode pattern 126, and the protruding branched electrode pattern 128). Moreover, each of the tapers between the protruding areas and the recess areas of the protective layer 140' has an inclined angle θ, and the inclined angle θ can be in the range of about 45° to about 90°, and is preferably in the range of about 80° to about 90°, so as to alleviate the phenomenon of light leakage in a dark state caused by inclined tapers.

Figure 18:
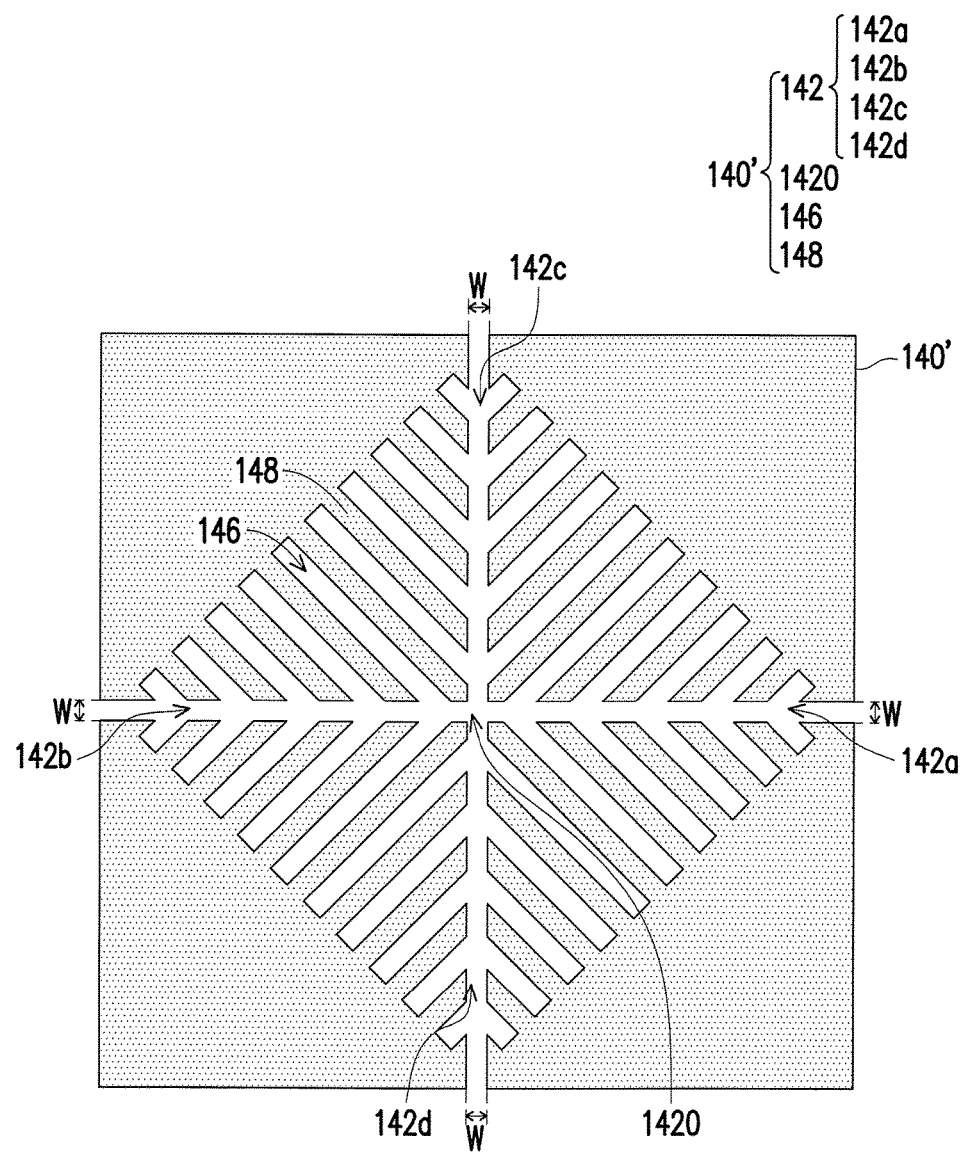
FIG. 18 is a top schematic of a protective layer located below the pixel electrode in FIG. 16.

FIG. 18 is a top schematic of a protective layer located below the pixel electrode in FIG. 16. Referring to FIG. 18, the protective layer 140' has a recess main portion 142, a central recess main portion 1420, a plurality of recess branched portions 146, and a plurality of protruding branched portions 148. Each of the central recess main portion 1420 and the recess main portion 142 has a width W, and the width W is greater than 0 μm and less than or equal to 4 μm, and is preferably about 2 μm. As shown in FIG. 18, the recess main portion 142 has a first horizontal recess main portion 142$a$, a second horizontal recess main portion 142$b$, a first vertical recess main portion 142$c$, and a second vertical recess main portion 142$d$ connected to one another. In the present embodiment, the first horizontal recess main portion 142$a$, the second horizontal recess main portion 142$b$, the first vertical recess main portion 142$c$, and the second vertical recess main portion 142$d$ of the recess main portion 142 all maintain the same width W, but the invention is not limited thereto. In particular, the central recess main portion 1420 and the first horizontal recess main portion 142$a$ and the second horizontal recess main portion 142$b$ of the recess main portion 142 are connected to one another behind the same horizontal line; and the central recess main portion 1420 and the first vertical recess main portion 142$c$ and the second vertical recess main portion 142$d$ of the recess main portion 142 are connected to one another behind the same vertical line. In addition, the plurality of recess branched portions 146 is extended along at least four directions and connected to the recess main portion 142, and therefore the individual recess branched portions 146 extended along different directions are not directly in contact with one another or connected to one another, and a protruding branched portion 148 is between two adjacent recess branched portions 146 and between the recess main portion 142 and any adjacent recess branched portion 146. Via the staggered configuration of the recess main portion 142, the central recess main portion 1420, the recess branched portions 146, and the protruding branched portions 148 of the protective layer 140', the protective layer 140' can have undulating areas.

Figure 19:
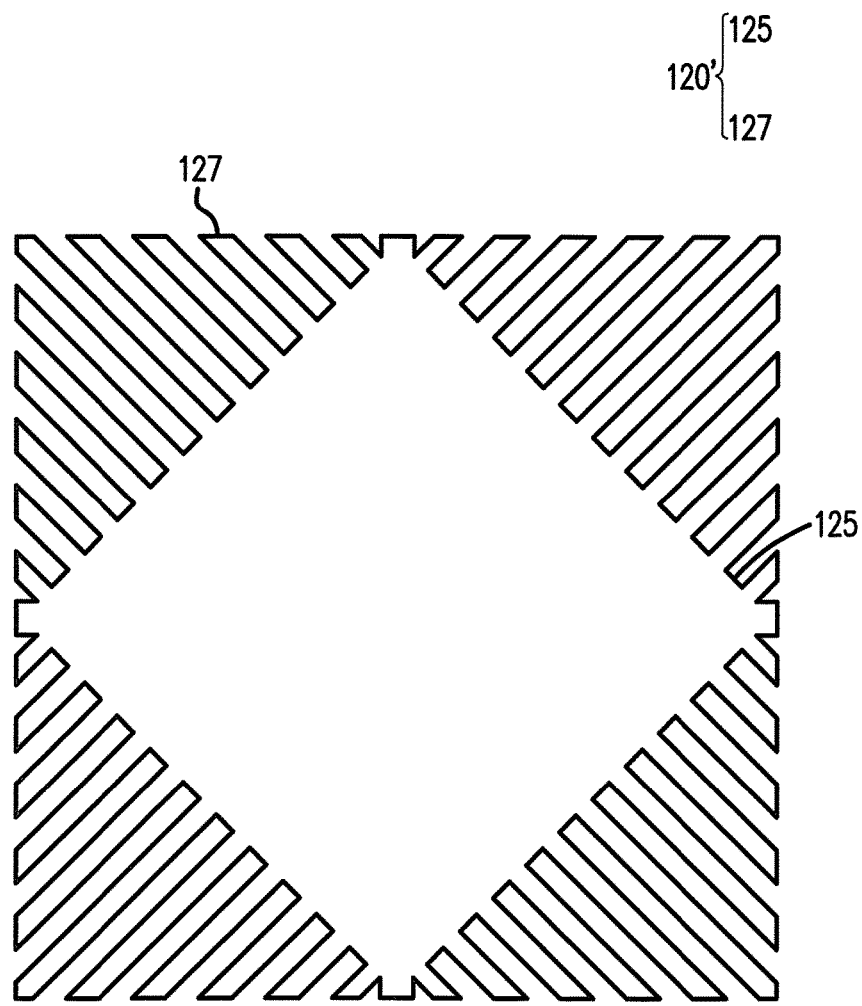
FIG. 19 is a top schematic of the pixel electrode in FIG. 16.

FIG. 19 is a top schematic of the pixel electrode in FIG. 16. Referring to FIG. 19, a pixel electrode 120' has a plurality of outer branched electrodes 127 and a plurality of block-shaped electrodes 125. The block-shaped electrodes 125 are located in the center of the pixel electrode 120', and the block-shaped electrodes 125 do not have openings, holes, slits, grooves, or gaps. The block-shaped electrodes 125 of the present embodiment are, for instance, rectangular, but the invention is not limited thereto. In other embodiments, the block-shaped electrodes 125 are, for instance, hexagonal or polygonal. The plurality of outer branched electrodes 127 is located in the periphery of the block-shaped electrodes 125 and connected to the block-shaped electrodes 125. In particular, the outer branched electrodes 127 of the pixel electrode 120' are, for instance, disposed corresponding to the direction of extension of the protruding branched portions 148 of the protective layer 140' (i.e., the direction of extension from the center of the pixel structure 100 toward an edge thereof), and a gap, a slit, or a groove is between two adjacent outer branched electrodes 127 extended along the same direction. Moreover, the range of the aspect ratio (length:width) of the pixel electrode 120' is about 1:2, preferably about 1:1.

Via the above dispositions of the protective layer and the pixel electrode, in addition to ensuring the display panel of the invention has good transmittance and liquid crystal response time, since the pixel structure of the invention has the desired undulating structure, the phenomenon of unstable liquid crystal reversal and the phenomenon of light leakage in a dark state can be prevented, and as a result good display effect can be achieved.

Figure 20:
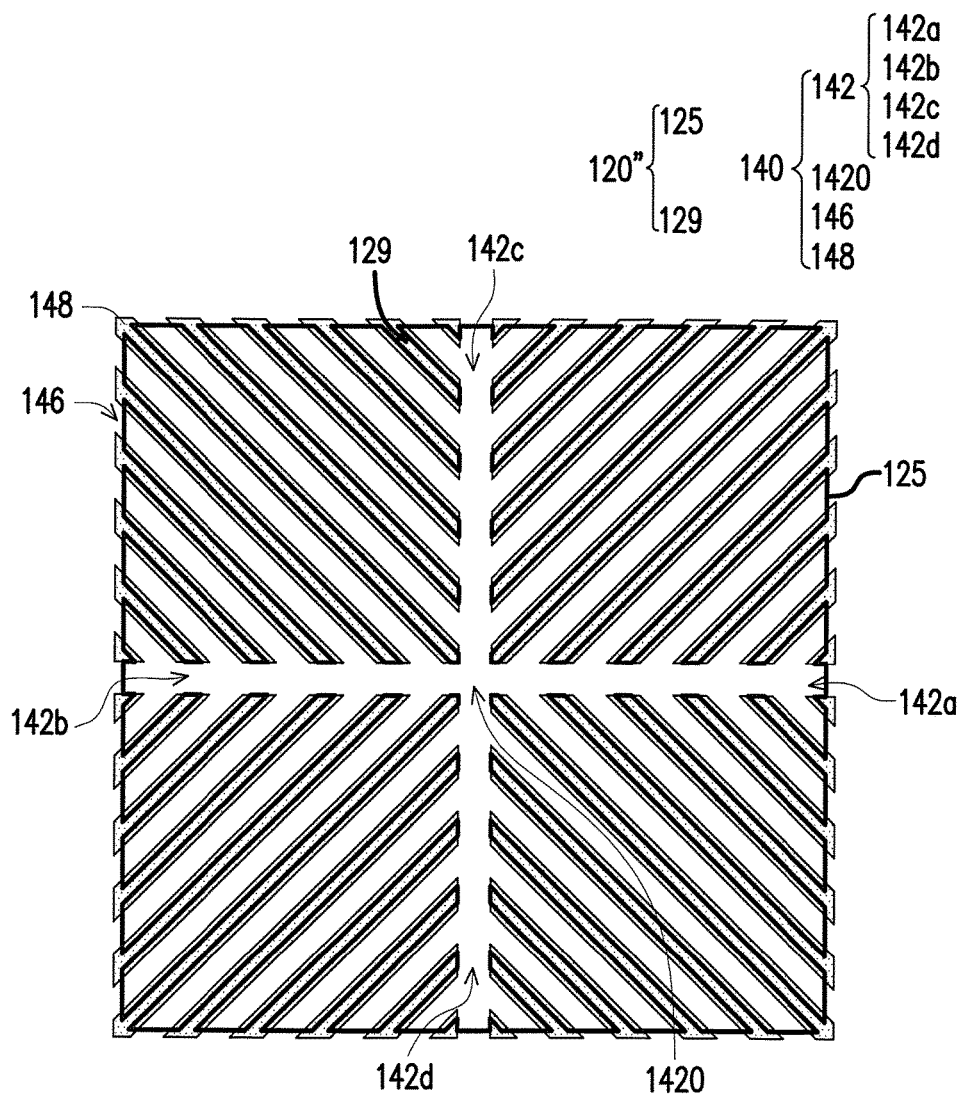
FIG. 20 is a top schematic of a pixel electrode in a pixel structure and a protective layer located below the pixel electrode according to another embodiment of the invention.
Figure 21:
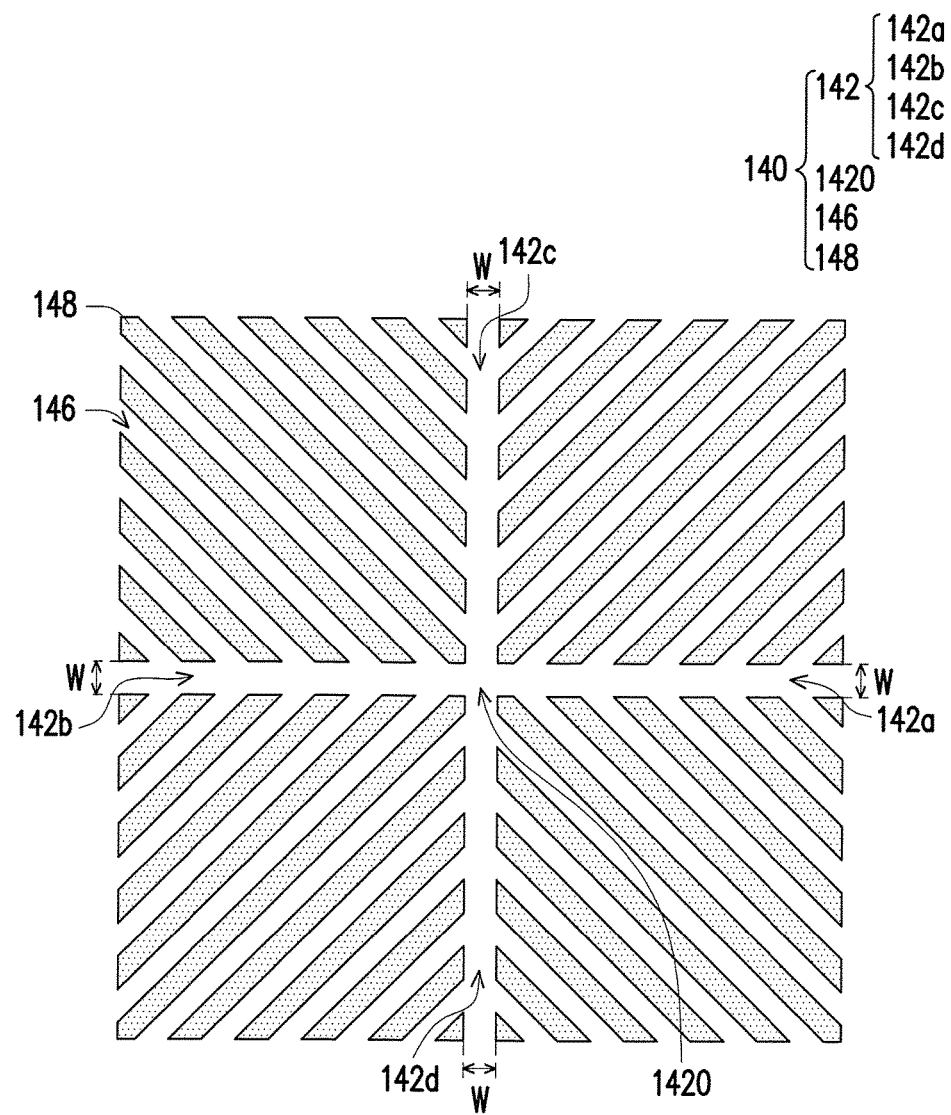
FIG. 21 is a top schematic of a protective layer located below the pixel electrode in FIG. 20.
Figure 22:
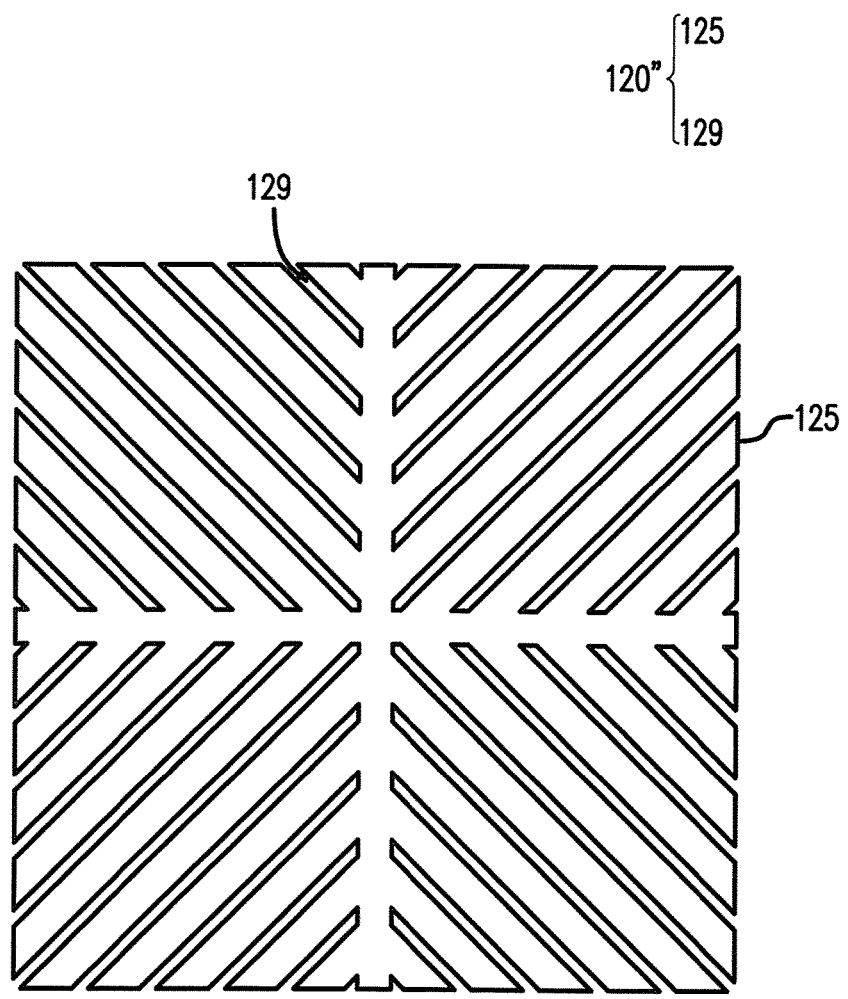
FIG. 22 is a top schematic of the pixel electrode in FIG. 20.

FIG. 20 is a top schematic of a pixel electrode in a pixel structure and a protective layer located below the pixel electrode according to another embodiment of the invention. FIG. 21 is a top schematic of a protective layer located below the pixel electrode in FIG. 20. FIG. 22 is a top schematic of the pixel electrode in FIG. 20. Referring to FIG. 20, a pixel electrode 120" has a plurality of block-shaped electrodes 125 and a plurality of electrode slit patterns 129, and the plurality of electrode slit patterns 129 is located in the block-shaped electrodes 125; and the protective layer 140 has a recess main portion 142, a central recess main portion 1420, recess branched portions 146, and protruding branched portions 148, wherein the recess main portion 142 has a first horizontal recess main portion 142a, a second horizontal recess main portion 142b, a first vertical recess main portion 142c, and a second vertical recess main portion 142d connected to one another. Detailed structures of the pixel electrode 120" and the protective layer 140 are described later.

Referring to FIG. 20, the pixel electrode 120" is formed above the protective layer 140, wherein each of the central recess main portion 1420 and the recess main portion 142 of the protective layer 140 has a depth d, and the depth d is greater than or equal to 0.05 µm and less than or equal to 0.3 µm, and is preferably greater than or equal to about 0.05 µm and less than or equal to about 0.1 µm. It should be mentioned that, the depth of each of the recess branched portions 146 can be adjusted according to design requirement, and the invention does not particularly limit the depth of each of the recess branched portions 146. In the present embodiment, each of the electrode slit patterns 129 of the pixel electrode 120" is disposed, for instance, corresponding to the protruding branched portions 148 in the protective layer 140, and the block-shaped electrodes 125 of the pixel electrode 120" conformably cover the recess main portion 142, the central recess main portion 1420, the recess branched portions 146, and the protruding branched portions 148 of the protective layer 140, such that the pixel electrode 120 is recessed in accordance with the central recess main portion 1420, the recess main portion 142, and the recess branched portions 146 and the pixel electrode 120' is protruded in accordance with the protruding branched portions 148, so that the pixel electrode 120 respectively has a recess main electrode pattern 122, a recess branched electrode pattern 126, and a protruding branched electrode pattern 128. In other words, each of the electrode slit patterns 129 of the pixel electrode 120" is not overlapped with the recess branched portions 146 of the protective layer 140. Therefore, via the undulating areas from the staggered configuration of the recess main portion 142, the central recess main portion 1420, the recess branched portions 146, and the protruding branched portions 148 of the protective layer 140, the pixel electrode 120 conformably covering the protective layer 140 has an undulating electrode contour (i.e., the recess main electrode pattern 122, the recess branched electrode pattern 126, and the protruding branched electrode pattern 128).

FIG. 21 is a top schematic of a protective layer located below the pixel electrode in FIG. 20. Referring to FIG. 21, the protective layer 140 has a recess main portion 142, a central recess main portion 1420, a plurality of recess branched portions 146, and a plurality of protruding branched portions 148. Each of the central recess main portion 1420 and the recess main portion 142 has a width W, and the width W is greater than 0 µm and less than or equal to 4 µm, and is preferably about 2 µm. As shown in FIG. 21, the recess main portion 142 has a first horizontal recess main portion 142a, a second horizontal recess main portion 142b, a first vertical recess main portion 142c, and a second vertical recess main portion 142d connected to one another. In the present embodiment, the first horizontal recess main portion 142a, the second horizontal recess main portion 142b, the first vertical recess main portion 142c, and the second vertical recess main portion 142d of the recess main portion 142 all maintain the same width W, but the invention is not limited thereto. In particular, the central recess main portion 1420 and the first horizontal recess main portion 142a and the second horizontal recess main portion 142b of the recess main portion 142 are connected to one another behind the same horizontal line; and the central recess main portion 1420 and the first vertical recess main portion 142c and the second vertical recess main portion 142d of the recess main portion 142 are connected to one another behind the same vertical line. In addition, the plurality of recess branched portions 146 is extended along at least four directions and connected to the recess main portion 142, and therefore the individual recess branched portions 146 extended along different directions are not directly in contact with one another or connected to one another, and a protruding branched portion 148 is between two adjacent recess branched portions 146 and between the recess main portion 142 and any adjacent recess branched portion 146. Via the staggered configuration of the recess main portion 142, the central recess main portion 1420, the recess branched portions 146, and the protruding branched portions 148 of the protective layer 140, the protective layer 140 can have undulating areas.

FIG. 22 is a top schematic of the pixel electrode in FIG. 20. Referring to FIG. 22, the pixel electrode 120" has block-shaped electrodes 125 and a plurality of electrode slit patterns 129. In the present embodiment, the block-shaped electrodes 125 have slits, grooves, and gaps. Specifically, the plurality of electrode slit patterns 129 is disposed on the protruding branched portions 148 of the block-shaped electrodes 125 corresponding to the protective layer 140. Therefore, the block-shaped electrodes 125 of the present embodiment have, for instance, slits, grooves, and gaps extended along at least four directions. Moreover, the range of the aspect ratio (length:width) of the pixel electrode 120" is about 1:2, preferably about 1:1.

Via the above disposition, the display panel of the invention can be ensured to have good transmittance and liquid crystal response time, and since the pixel structure of the invention has the desired undulating structure, the phenomenon of unstable liquid crystal reversal and the phenomenon of light leakage in a dark state can be prevented, thus achieving good display effect.

To prove that the dispositions of the protective layer and the pixel electrode of the display panel of the invention can indeed alleviate the phenomena of unstable liquid crystal reversal and light leakage in a dark state of the display panel, a number of experimental examples are provided. FIG. 23A is a liquid crystal reverse distribution graph of a traditional display panel. The size of the traditional display panel in FIG. 23A for the experiment is about 65 inches and the aspect ratio of the pixels is set to (1:1). Specifically, the protective layer of the traditional display panel of FIG. 23A does not contain a recess main portion and/or a central recess main portion.

Figure 23D:
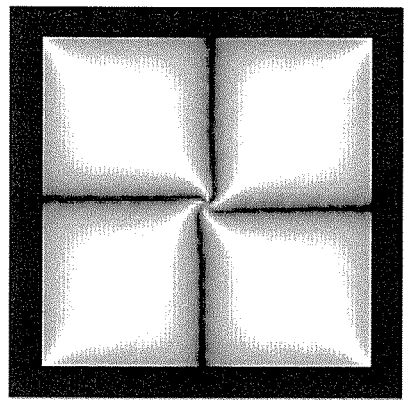
FIG. 23B to FIG. 23M are respectively liquid crystal reverse distribution graphs of the display panels of the embodiments of FIG. 3, FIG. 5 to FIG. 8, FIG. 10 to FIG. 11, FIG. 13 to FIG. 16, and FIG. 20.
Figure 23E:
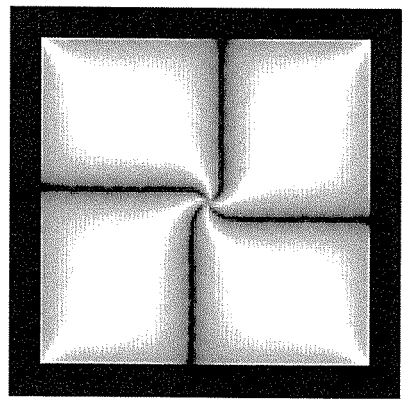
Figure 23C:
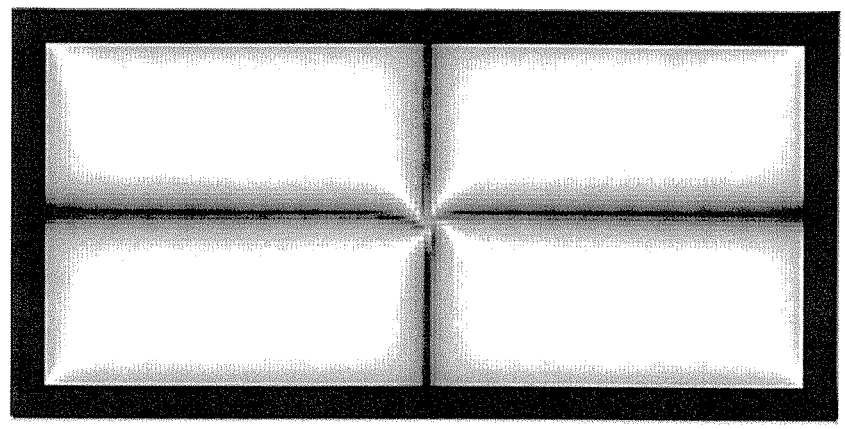
Figure 23A:
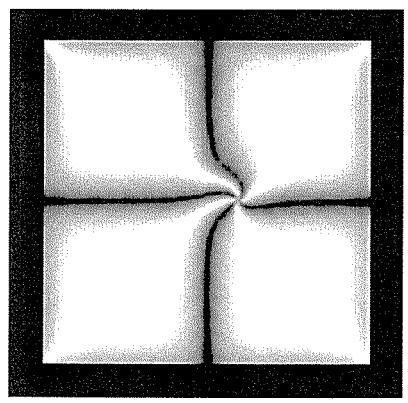
FIG. 23A is a liquid crystal reverse distribution graph of a traditional display panel.
Figure 23B:
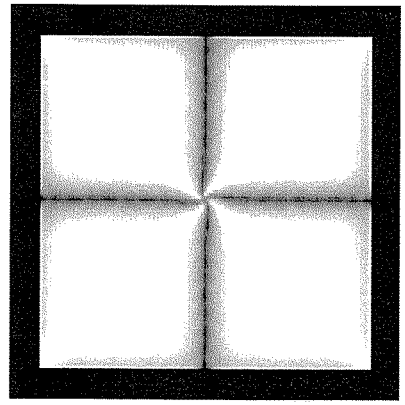
Figure 23F:
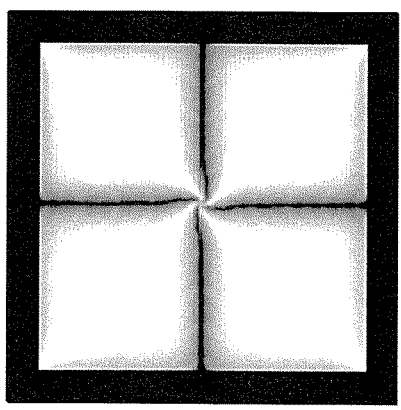
Figure 23G:
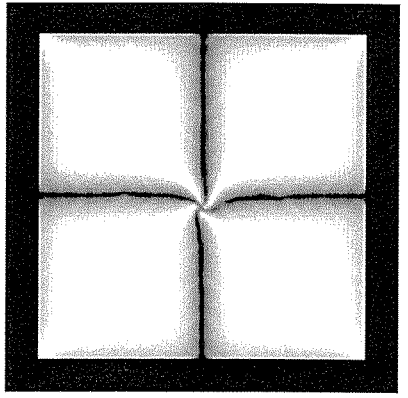
Figure 23H:
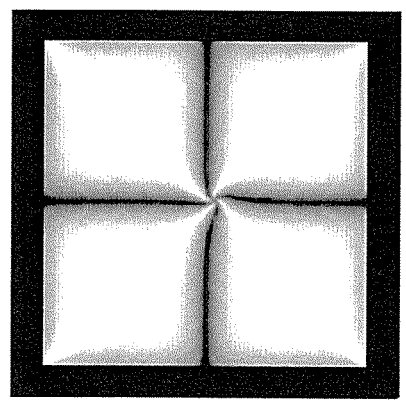
Figure 23I:
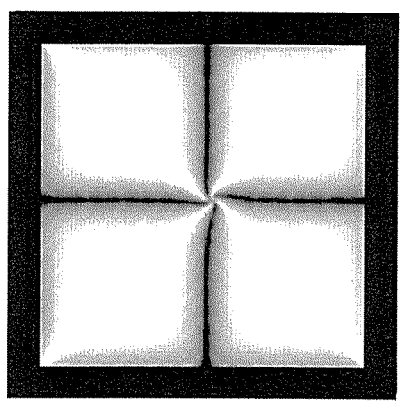
Figure 23J:
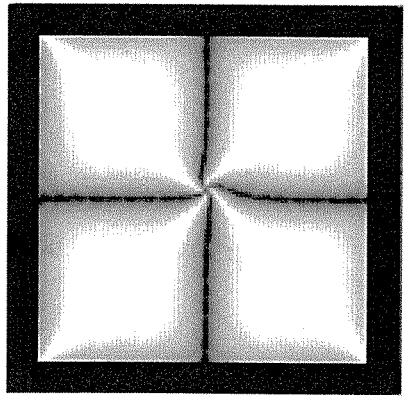
Figure 23K:
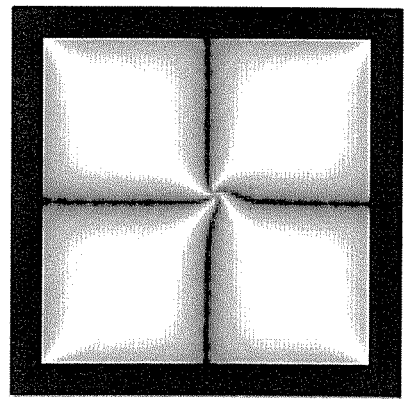
Figure 23M:
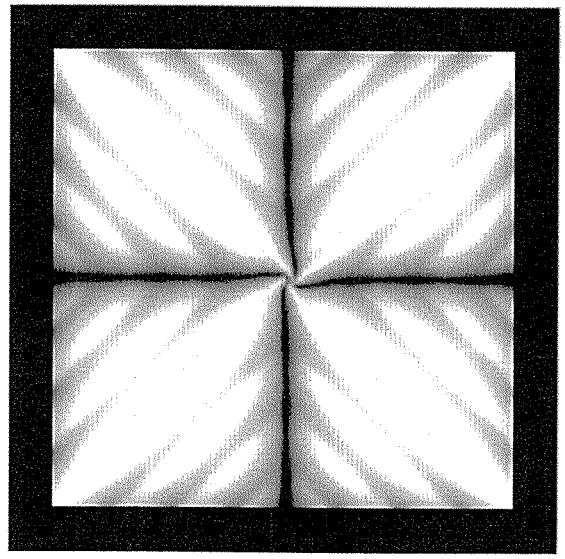
Figure 23L:
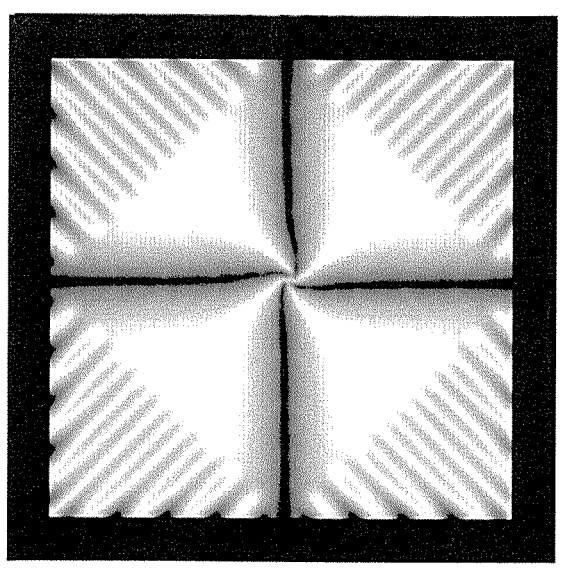

FIG. 23B to FIG. 23M are respectively liquid crystal reverse distribution graphs of the display panels of the embodiments of FIG. 3, FIG. 5 to FIG. 8, FIG. 10 to FIG. 11, FIG. 13 to FIG. 16, and FIG. 20. The size of each of the display panels in FIG. 23B to FIG. 23M used for the experiment is about 65 inches; in particular, the aspect ratio of the pixels of FIG. 23B and FIG. 23D to FIG. 23M is set to (1:1), and the aspect ratio of the pixels of FIG. 23C is set to (2:1). Specifically, the protective layer of each of the display panels of FIG. 23B to FIG. 23M includes a recess main portion and/or a central recess main portion. More specifically, the protective layer in each of the display panels represented by FIG. 23B, FIG. 23D, FIG. 23E, FIG. 23F, FIG. 23G, FIG. 23H, FIG. 23I, FIG. 23J, and FIG. 23K includes a recess main portion and/or a central recess main portion having a depth d equal to 0.1 µm and a width W equal to 2 µm. The protective layer in the display panel represented by FIG. 23C includes a recess main portion having a depth d equal to 0.1 µm and a width W equal to 2 µm and a central recess main portion having a depth d equal to 0.1 µm and a width W2 equal to 4 µm. The protective layer in each of the display panels represented by FIG. 23L and FIG. 23M includes a recess main portion and a central recess main portion each having a depth d equal to 0.1 µm and a width W equal to 4 µm. In each experimental example, the same operating voltage is applied to the display panel of each experimental example, such that a consistent voltage difference is between upper and lower electrode layers (such as an opposite electrode and a pixel electrode) in the display panel of each experimental example. Under the same voltage difference, the liquid crystal reverse distribution graph of the display panel of each of FIG. 23B to FIG. 23M is compared to the liquid crystal reverse distribution graph of the display panel of FIG. 23A; in comparison to the display panel of FIG. 23A, the display panels of FIG. 23B to FIG. 23M can indeed inhibit the situation in which the central node shown in FIG. 23A is randomly displaced, and as a result, the phenomena of unstable liquid crystal reversal and light leakage in a dark state can be alleviated, and therefore the display panels of FIG. 23B to FIG. 23M have better contrast and transmittance.

Based on the above, in the pixel structure of the display panel of the invention, via the staggered configuration of the central recess main portion, the recess main portion, the recess branched portions, the central protruding main portion, the protruding main portion, and the protruding branched portions of the protective layer after patterning, the protective layer can have undulating areas, such that the pixel electrode conformably covering the protective layer also has an undulating electrode contour (such as a recess main electrode pattern, a recess branched electrode pattern, and a protruding main electrode pattern). Via the above disposition, in addition to ensuring the display panel has good transmittance and liquid crystal response time, since the pixel structure of the invention has the desired undulating structure, the phenomenon of unstable liquid crystal reversal can be prevented, contrast ratio can be improved, and the phenomenon of light leakage in a dark state can be alleviated, and as a result good display effect can be achieved.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A display panel, comprising:
    a first substrate;
    a plurality of pixel structures, wherein each of the pixel structures comprises:
        a scan line and a data line located on the first substrate;
        an active device located on the first substrate and comprising a gate, a source, and a drain, wherein the gate of the active device and the scan line are electrically connected and the source of the active device and the data line are electrically connected;
        a pixel electrode located on the first substrate and electrically connected to the drain of the active device, wherein the pixel electrode has at least one block-shaped electrode; and
        a protective layer located on the first substrate and located below the pixel electrode, wherein the protective layer comprises a recess main portion and a plurality of recess branched portions, a width of the recess main portion is greater than 0 nm and equal to or less than 4 µm, and the recess branched portions are extended along at least four directions, wherein the pixel electrode conformably covers the recess main portion and the recess branched portions of the protective layer;
    a second substrate located at an opposite side of the first substrate;
    an opposite electrode located on the second substrate;
    a display medium located between the opposite electrode and the pixel electrode; and
    at least one polarizer located on at least one of the first substrate and the second substrate, wherein a direction of an adsorption axis of the polarizer is different from the four directions of extension of the recess branched portions.

2. The display panel of claim 1, wherein a depth of the recess main portion of the protective layer is ≤0.3 µm, the pixel electrode conformably covers the recess main portion of the protective layer such that the pixel electrode is recessed in accordance with the recess main portion, so that the pixel electrode has a recess main electrode pattern.

3. The display panel of claim 1, wherein a width of the recess main portion of the protective layer is gradually increased from a center of the pixel structure toward at least one edge.

4. The display panel of claim 1, wherein the recess main portion of the protective layer comprises:
    a first horizontal recess main portion and a second horizontal recess main portion, wherein the first horizontal recess main portion and the second horizontal recess main portion are not aligned with each other; and
    a first vertical recess main portion and a second vertical recess main portion, wherein the first vertical recess main portion and the second vertical recess main portion are not aligned with each other, wherein the first horizontal recess main portion, the second horizontal recess main portion, the first vertical recess main portion, and the second vertical recess main portion are connected together.

5. The display panel of claim 4, wherein the recess main portion of the protective layer further comprises a central recess main portion, and the first horizontal recess main portion, the second horizontal recess main portion, the first vertical recess main portion, and the second vertical recess main portion are respectively connected to the central recess main portion.

6. The display panel of claim 1, wherein:
a depth of the recess main portion of the protective layer is ≤0.3 μm, the recess main portion is connected to a portion of the recess branched portions, the pixel electrode conformably covers the recess main portion of the protective layer such that the pixel electrode is recessed in accordance with the recess main portion, so that the pixel electrode has a recess main electrode pattern; and
the protective layer further comprises a protruding main portion connected to the recess main portion and connected to another portion of the recess branched portions, and the pixel electrode conformably covers the protruding main portion of the protective layer such that the pixel electrode is protruded in accordance with the protruding main portion, so that the pixel electrode has a protruding main electrode pattern.

7. The display panel of claim 6, wherein the protruding main portion is a central protruding main portion, and the recess main portion is extended toward four directions from the central protruding main portion.

8. The display panel of claim 7, wherein a length of the recess main portion is greater than or equal to one-third of a length of the central protruding main portion.

9. The display panel of claim 6, wherein the protective layer further comprises:
a central protruding main portion, wherein the protruding main portion is extended toward four directions from the central protruding main portion and is connected to the recess main portion and connected to another portion of the recess branched portions.

10. The display panel of claim 9, wherein the protruding main electrode pattern is located in a center of the pixel structure.

11. The display panel of claim 6, wherein the protective layer further comprises:
a central recess main portion, wherein the recess main portion is extended toward four directions from the central recess main portion and is connected to the protruding main portion and connected to another portion of the recess branched portions.

12. The display panel of claim 11, wherein a length of the recess main portion is greater than or equal to one-third of a length of the protruding main portion.

13. The display panel of claim 11, wherein the recess main electrode pattern is located in a center of the pixel structure.

14. The display panel of claim 1, wherein the recess main portion is a central recess main portion, a depth of the central recess main portion is ≤0.3 um, the central recess main portion is connected to a portion of the recess branched portions, and the pixel electrode conformably covers the recess main portion of the protective layer, such that the pixel electrode is recessed in accordance with the recess main portion, so that the pixel electrode has a recess main electrode pattern.

15. The display panel of claim 1, wherein a depth of the recess main portion of the protective layer is ≤0.3 um, the recess main portion is connected to a portion of the recess branched portions, and the pixel electrode conformably covers the recess main portion of the protective layer, such that the pixel electrode is recessed in accordance with the recess main portion, so that the pixel electrode has a recess main electrode pattern.

16. The display panel of claim 15, wherein the recess main electrode pattern is located in a center of the pixel structure.

17. The display panel of claim 1, wherein:
a depth of the recess main portion of the protective layer is ≤0.3 um, the at least one block-shaped electrode portion of the pixel electrode conformably covers the recess main portion of the protective layer such that the pixel electrode is recessed in accordance with the recess main portion, so that the pixel electrode has a recess main electrode pattern; and
the pixel electrode further comprises a plurality of outer branched electrodes, wherein the outer branched electrodes are electrically connected to the at least one block-shaped electrode.

18. The display panel of claim 1, wherein:
a depth of the recess main portion of the protective layer is ≤0.3 um, the pixel electrode conformably covers the recess main portion of the protective layer such that the pixel electrode is recessed in accordance with the recess main portion, so that the pixel electrode has a recess main electrode pattern;
the at least one block-shaped electrode of the pixel electrode has a plurality of electrode slit patterns, wherein the recess branched portions of the protective layer and the electrode slit patterns of the pixel electrode are not disposed in an overlapping manner.

* * * * *